United States Patent
Umeda et al.

(10) Patent No.: US 8,872,227 B2
(45) Date of Patent: Oct. 28, 2014

(54) NITRIDE SEMICONDUCTOR DEVICE

(75) Inventors: Hidekazu Umeda, Osaka (JP); Yoshiharu Anda, Osaka (JP); Tetsuzo Ueda, Osaka (JP); Tsuyoshi Tanaka, Osaka (JP); Daisuke Ueda, Kyoto (JP)

(73) Assignee: Panasonic Corporation, Osaka (JP)

( * ) Notice: Subject to any disclaimer, the term of this patent is extended or adjusted under 35 U.S.C. 154(b) by 272 days.

(21) Appl. No.: 13/402,631

(22) Filed: Feb. 22, 2012

(65) Prior Publication Data
US 2012/0153355 A1 Jun. 21, 2012

Related U.S. Application Data

(63) Continuation of application No. PCT/JP2010/005205, filed on Aug. 24, 2010.

(30) Foreign Application Priority Data

Aug. 27, 2009 (JP) .................................. 2009-196501
Jul. 2, 2010 (WO) .................. PCT/JP2010/004368

(51) Int. Cl.
*H01L 29/66* (2006.01)
*H01L 29/778* (2006.01)
*H01L 29/417* (2006.01)
*H01L 29/20* (2006.01)

(52) U.S. Cl.
CPC ........ *H01L 29/2003* (2013.01); *H01L 29/7787* (2013.01); *H01L 29/4175* (2013.01); *H01L 29/66462* (2013.01)
USPC ............ 257/192; 257/E29.255; 257/E33.025; 257/E33.028; 257/E33.033

(58) Field of Classification Search
USPC ........... 257/192, E29.255, E33.025, E33.028, 257/E33.033
See application file for complete search history.

(56) References Cited

U.S. PATENT DOCUMENTS

| | | | |
|---|---|---|---|
| 6,015,979 A | 1/2000 | Sugiura et al. | |
| 2004/0099888 A1 | 5/2004 | Sriram | |
| 2006/0170003 A1 | 8/2006 | Saito et al. | |
| 2006/0186426 A1 * | 8/2006 | Nunoue et al. .................. | 257/98 |
| 2006/0220178 A1 | 10/2006 | Kubo et al. | |
| 2006/0261356 A1 | 11/2006 | Iwakami et al. | |
| 2006/0273347 A1 | 12/2006 | Hikita et al. | |
| 2010/0283083 A1 | 11/2010 | Niiyama et al. | |

FOREIGN PATENT DOCUMENTS

| | | |
|---|---|---|
| CN | 1841767 A | 10/2006 |
| CN | 101320750 A | 12/2008 |
| JP | 2004-327891 | 11/2004 |
| JP | 2004-327891 A | 11/2004 |

(Continued)

OTHER PUBLICATIONS

English translation of Chinese Search Report issued in Chinese Application No. 201080037631.0, 2 pgs.

(Continued)

*Primary Examiner* — Timor Karimy
(74) *Attorney, Agent, or Firm* — McDermott Will & Emery LLP

(57) ABSTRACT

A nitride semiconductor device includes a semiconductor substrate, and a nitride semiconductor layer formed on the semiconductor substrate. The semiconductor substrate includes a normal region and an interface current block region surrounding the normal region. The nitride semiconductor layer includes an element region and an isolation region surrounding the element region. The element region is formed over the normal region. The interface current block region contains impurities, and forms a potential barrier against carriers generated at an interface between the nitride semiconductor layer and the semiconductor substrate.

22 Claims, 20 Drawing Sheets

(56) References Cited

FOREIGN PATENT DOCUMENTS

| JP | 2004-342810 | 12/2004 |
|---|---|---|
| JP | 2004-342810 A | 12/2004 |
| JP | 2005-217049 | 8/2005 |
| JP | 2007-208037 | 8/2007 |
| JP | 2007-208037 A | 8/2007 |
| JP | 2008-159674 A | 7/2008 |
| JP | 2008-177515 | 7/2008 |
| JP | 2008-177515 A | 7/2008 |
| WO | WO 2007/145279 A1 | 12/2007 |

OTHER PUBLICATIONS

International Search Report issued in International Patent Application No. PCT/JP2010/005205, mailed on Sep. 21, 2010.
International Search Report issued in International Patent Application No. PCT/JP2010/004368, mailed on Sep. 21, 2010.

* cited by examiner

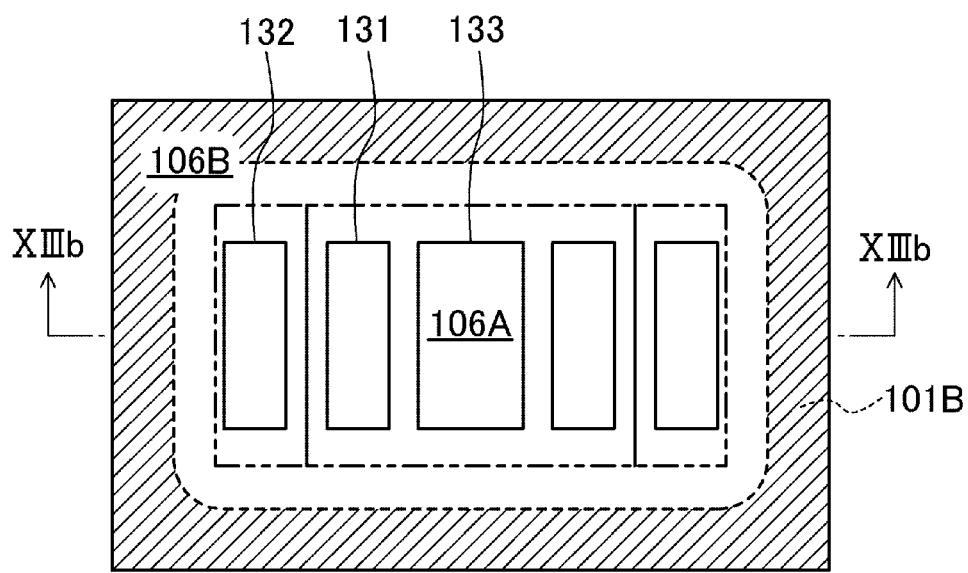
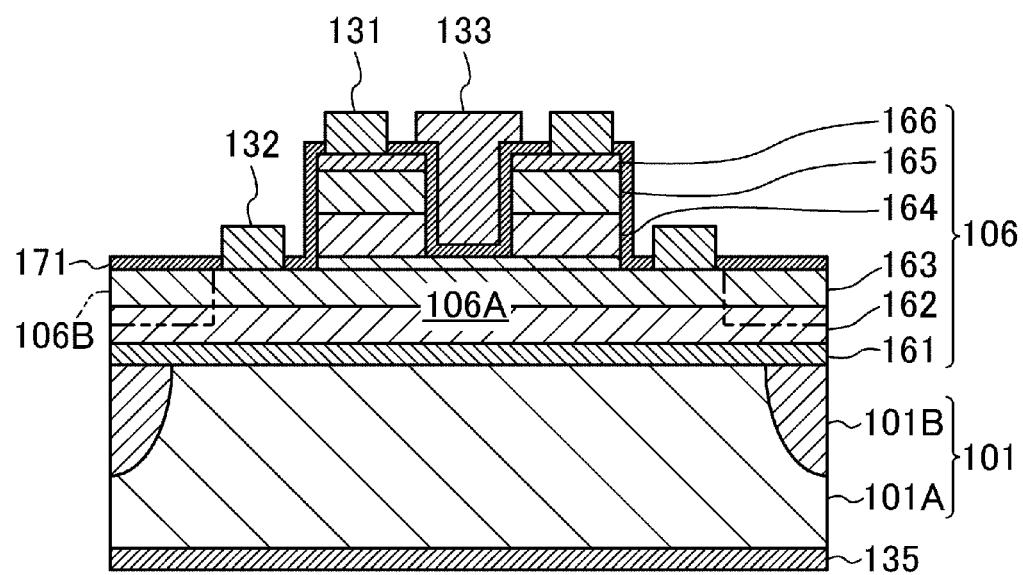

NITRIDE SEMICONDUCTOR DEVICE

CROSS-REFERENCE TO RELATED APPLICATION

This is a continuation of PCT International Application PCT/JP2010/005205 filed on Aug. 24, 2010, which claim priority to Japanese Patent Application No. 2009-196501 filed on Aug. 27, 2009 and PCT International Application PCT/JP2010/004368 filed on Jul. 2, 2010. The disclosures of these applications including the specifications, the drawings, and the claims are hereby incorporated by reference in their entirety.

BACKGROUND

The present disclosure relates to nitride semiconductor devices and more particularly to nitride semiconductor devices and applicable as power transistors in power supply circuits etc.

Nitride semiconductor represented by gallium nitride (GaN) draws attention as a material of a high-frequency semiconductor device or a high-output semiconductor device. The use of a silicon (Si) substrate for fabrication of nitride semiconductor devices is considered. A large-size Si substrate can be easily provided. If a Si substrate is used as a substrate for growing nitride semiconductor, costs of manufacturing a nitride semiconductor device can be largely reduced.

Operations of a nitride semiconductor device formed on a Si substrate are affected by the potential of the Si substrate. Thus, in order to stabilize the potential of the Si substrate, an electrode formed on the back surface of the Si substrate is connected to a source electrode or a drain electrode via a through electrode which penetrates a nitride semiconductor layer and the Si substrate. When the back surface electrode is electrically connected to the source electrode or the drain electrode, a high voltage is applied between the back surface electrode and the source electrode or the drain electrode. It is thus necessary to increase the breakdown voltage of the semiconductor device in the longitudinal direction. The breakdown voltage of the semiconductor device on the Si substrate in the longitudinal direction depends on the breakdown voltage of the nitride semiconductor layer grown on the Si substrate, and the breakdown voltage of the Si substrate. In order to increase the breakdown voltage of the nitride semiconductor layer, the thickness of the nitride semiconductor layer needs to be increased. However, a thickness of a nitride semiconductor layer which can be formed on a Si substrate is limited, since lattice constants and thermal expansion coefficients of Si and nitride semiconductor are significantly different.

Therefore, improving the breakdown voltage of a semiconductor device in the longitudinal direction by increasing the breakdown voltage of a Si substrate is considered. (See, for example, Japanese Patent Publication No. 2005-217049).

SUMMARY

However, the present inventors found that the breakdown voltage of a semiconductor device in the longitudinal direction is hardly changed even by increasing the breakdown voltage of a Si substrate. They also found that not only a Si substrate but also other semiconductor substrates such as a silicon carbide (SiC) substrate and a gallium arsenide (GaAs) substrate have similar problems.

Based on the findings, it is an objective of the present disclosure to provide a nitride semiconductor device with an improved breakdown voltage in the longitudinal direction when a semiconductor substrate is used.

In order to achieve the objective, a nitride semiconductor device according to the present disclosure includes a semiconductor substrate including an interface current block region.

Specifically, an example nitride semiconductor device includes a semiconductor substrate, and a nitride semiconductor layer formed on the semiconductor substrate. The semiconductor substrate includes a normal region and an interface current block region surrounding the normal region. The nitride semiconductor layer includes an element region and an isolation region surrounding the element region. The element region is formed over the normal region. The interface current block region contains impurities, and forms a potential barrier against carriers generated at an interface between the nitride semiconductor layer and the semiconductor substrate.

As such, the example nitride semiconductor device includes the interface current block region which contains impurities and serves as the potential barrier against the carriers generated at the interface between the nitride semiconductor layer and the semiconductor substrate. This reduces formation of a current path at the interface between the nitride semiconductor layer and the semiconductor substrate. Therefore, a current flows not through the side surface of the semiconductor substrate but through the inside the semiconductor substrate, and the breakdown voltage of the semiconductor substrate in the longitudinal direction contributes to the breakdown voltage of the nitride semiconductor device in the longitudinal direction. This results in a great improvement in the breakdown voltage of the nitride semiconductor device in the longitudinal direction.

In the example nitride semiconductor device, the interface current block region may contain impurities of a same conductivity type as impurities in the normal region. The interface current block region may have a higher impurity concentration than the normal region, and may contain impurities of a different conductivity type from impurities in the normal region.

The interface current block region may include a first region containing impurities of a same conductivity type as impurities in the normal region, and a second region containing impurities of a different conductivity type from impurities in the normal region. The first region may have a higher impurity concentration than the normal region. In this case, the first region may be spaced apart from the second region.

In the example nitride semiconductor device, the interface current block region may be formed in a portion other than directly under the element region of the semiconductor substrate.

In the example nitride semiconductor device, the interface current block region may be exposed on a side surface of the semiconductor substrate.

In the example nitride semiconductor device, the semiconductor substrate may include a depletion layer formation region formed on an inner side of the interface current block region, spaced apart from the interface current block region, and containing impurities of a different conductivity type from impurities in the normal region. The semiconductor substrate may include a plurality of depletion layer formation regions, each formed on an inner side of the interface current block region, spaced apart from the interface current block region, and containing impurities of a different conductivity type from impurities in the normal region. The plurality of depletion layer formation regions are spaced apart from each other.

In the example nitride semiconductor device, the nitride semiconductor layer may be formed on a region of the semiconductor substrate on an inner side of the interface current block region. This structure reduces an influence of a current path appearing in the nitride semiconductor layer.

In the example nitride semiconductor device, the nitride semiconductor layer may include a first layer, and a second layer formed on the first layer and having a greater bandgap than the first layer. In this case, the nitride semiconductor device may further include a source electrode, a drain electrode, and a gate electrode. Furthermore, the nitride semiconductor layer includes a third layer selectively formed on the second layer and containing p-type impurities. The gate electrode may be formed on the third layer.

The example nitride semiconductor device may further include a cathode electrode and an anode electrode, which are formed on the nitride semiconductor layer.

The example nitride semiconductor device may further include a source electrode, a drain electrode, and a gate electrode, which are formed on the nitride semiconductor layer; and a gate insulating film formed between the gate electrode and the nitride semiconductor layer. The nitride semiconductor layer may include an n-type first layer, a p-type second layer, and an n-type third layer, which are sequentially formed on the semiconductor substrate, and a recess penetrating the third layer and the second layer, and reaching the first layer. The drain electrode may be formed in contact with the first layer. The source electrode may be formed in contact with the third layer. The gate electrode may be formed to fill the recess with the gate insulating film interposed therebetween.

In the example nitride semiconductor device, the interface current block region may have an impurity concentration of $1\times10^{16}$ cm$^{-3}$ or more.

The example nitride semiconductor device may further include a back surface electrode formed on a surface of the semiconductor substrate opposite to the nitride semiconductor layer, and a through electrode penetrating the nitride semiconductor layer and the semiconductor substrate, and connected to the back surface electrode.

In the example nitride semiconductor device, the through electrode may be surrounded by the interface current block region on a top surface of the semiconductor substrate.

In the example nitride semiconductor device, the through electrode may be formed to penetrate the interface current block region.

The example nitride semiconductor device may further include a source electrode, a drain electrode, and a gate electrode, which are formed on the nitride semiconductor layer. The through electrode may be connected to any one of the source electrode, the drain electrode, or the gate electrode.

According to the semiconductor device of the present disclosure, the breakdown voltage of a nitride semiconductor device in the longitudinal direction can be improved where a semiconductor substrate is used.

BRIEF DESCRIPTION OF THE DRAWINGS

FIG. 1A is a top view. FIG. 1B is a cross-sectional view taken along the line Ib-Ib of FIG. 1A.

FIG. 2A is a top view. FIG. 2B is a cross-sectional view taken along the line IIb-IIb of FIG. 2A.

FIG. 4A is a top view. FIG. 4B is a cross-sectional view taken along the line IVb-IVb of FIG. 4A.

FIG. 5A is a top view. FIG. 5B is a cross-sectional view taken along the line Vb-Vb of FIG. 5A.

FIG. 6A is a top view. FIG. 6B is a cross-sectional view taken along the line VIb-VIb of FIG. 6A.

FIG. 7A is a top view. FIG. 7B is a cross-sectional view taken along the line VIIb-VIIb of FIG. 7A.

FIG. 8A is a top view. FIG. 8B is a cross-sectional view taken along the line VIIIb-VIIIb of FIG. 8A.

FIG. 9A is a top view. FIG. 9B is a cross-sectional view taken along the line IXb-IXb of FIG. 9A.

FIG. 10A is a top view. FIG. 10B is a cross-sectional view taken along the line Xb-Xb of FIG. 10A.

FIG. 11A is a top view. FIG. 11B is a cross-sectional view taken along the line XIb-XIb of FIG. 11A.

FIG. 12A is a top view. FIG. 12B is a cross-sectional view taken along the line XIIb-XIIb of FIG. 12A.

FIGS. 13A and 13B illustrate a semiconductor device according to a variation of the first embodiment. FIG. 13A is a top view. FIG. 13B is a cross-sectional view taken along the line XIIIb-XIIIb of FIG. 13A.

FIG. 14A is a top view. FIG. 14B is a cross-sectional view taken along the line XIVb-XIVb of FIG. 14A.

FIG. 15A is a top view. FIG. 15B is a cross-sectional view taken along the line XVb-XVb of FIG. 15A.

FIG. 16A is a top view. FIG. 16B is a cross-sectional view taken along the line XVIb-XVIb of FIG. 16A.

FIG. 17A is a top view. FIG. 17B is a cross-sectional view taken along the line XVIIb-XVIIb of FIG. 17A.

FIG. 18A is a top view. FIG. 18B is a cross-sectional view taken along the line XVIIIb-XVIIIb of FIG. 18A.

DETAILED DESCRIPTION

Figure 1A:
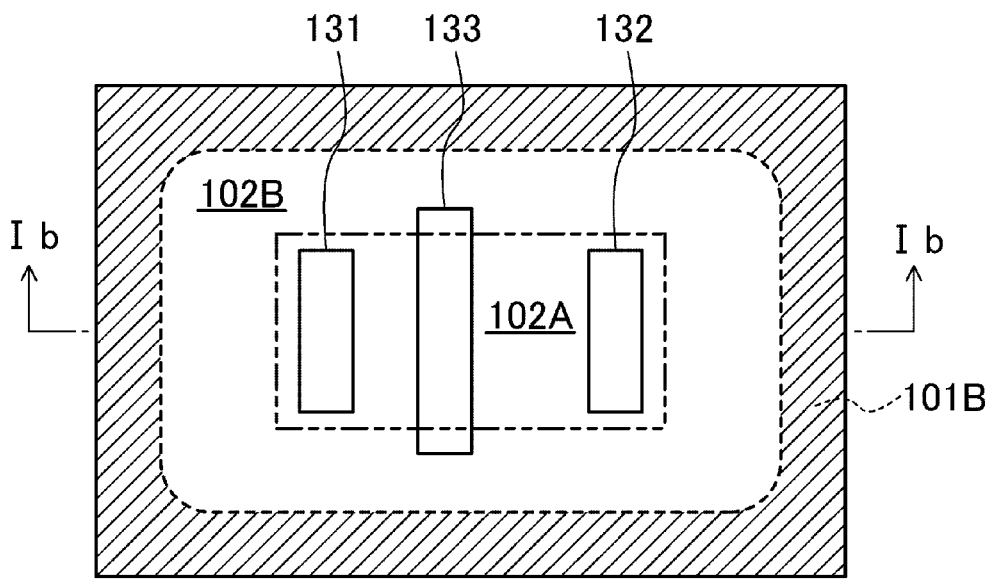
FIGS. 1A and 1B illustrate a semiconductor device according to a first embodiment.

In the present disclosure, AlGaN represents ternary compound $Al_xGa_{1-x}N$, where $0 \leq x \leq 1$. Multi-element compounds are expressed simply by the arrangement of chemical symbols such as AlInN, GaInN, etc. For example, nitride semiconductor $Al_xGa_{1-x-y}In_yN$, where $0 \le x \le 1$, $0 \le y \le 1$, and $x+y \le 1$, is expressed simply by AlGaInN. The wording "undoped" means that impurities are not intentionally introduced.

First, the relationship between the breakdown voltage of a semiconductor substrate and a breakdown voltage of a semiconductor device in the longitudinal direction found by the present inventors will be described below.

First, the present inventors prepared semiconductor devices for evaluation by forming nitride semiconductor layers with a predetermined thickness on p-type Si substrates and n-type Si substrates having various carrier concentrations, and measured the breakdown voltages of the semiconductor devices for evaluation in the longitudinal direction. Each of the breakdown voltages of the semiconductor devices for evaluation in the longitudinal direction is expected to be the sum of the breakdown voltages of the Si substrate in the longitudinal direction and the breakdown voltage of the nitride semiconductor layer in the longitudinal direction. It is known that the breakdown voltage of Si largely changes depending on its carrier concentration. In general, the width of a depletion layer increases with a decrease in the carrier concentration of Si, and thus the breakdown voltage tends to increase. Therefore, a semiconductor device for evaluation formed on a Si substrate with a low carrier concentration is expected to have a high breakdown voltage in the longitudinal direction. However, the breakdown voltage obtained by the measurement was almost constant and not dependent on the carrier concentration of the Si substrate. This shows that the breakdown voltage of the Si substrate in the longitudinal direction contributes little to the breakdown voltage of the semiconductor device for evaluation in the longitudinal direction.

Furthermore, the present inventors measured the capacitance of the semiconductor devices for evaluation. They found by the measurement that in a nitride semiconductor layer formed on a p-type Si substrate, when a positive voltage is applied to the nitride semiconductor layer with respect to the potential of the p-type Si substrate, the conductivity of the p-type Si around the interface between the p-type Si substrate and the nitride semiconductor layer is converted to the n type, thereby forming a highly-concentrated electron inversion layer. They also found that when a negative voltage is applied to the nitride semiconductor layer with respect to the potential of the p-type Si substrate, a hole accumulation layer is formed at the interface between the p-type Si substrate and the nitride semiconductor layer.

Similarly, they found that in a nitride semiconductor formed on an n-type Si substrate, when a negative voltage is applied to the nitride semiconductor layer with respect to the potential of the n-type Si substrate, the conductivity of the n-type semiconductor layer around the interface between the n-type Si substrate and the nitride semiconductor is converted to the p type, thereby forming a highly-concentrated hole inversion layer. They also found that, when a positive voltage is applied to the nitride semiconductor layer with respect to the potential of the n-type Si substrate, an electron accumulation layer is formed at the interface between the n-type Si substrate and the nitride semiconductor layer.

When a carrier layer such as an electron inversion layer, an electron accumulation layer, a hole inversion layer, and a hole accumulation layer is formed; a current path reaching a side surface of the Si substrate is formed at the interface between the nitride semiconductor layer and the Si substrate. Thus, when a voltage in the longitudinal direction is applied to the nitride semiconductor layer, a current flows not via the inside of the Si substrate but via the current path formed at the interface between the nitride semiconductor layer and the Si substrate, and the side surface of the Si substrate. Therefore, the breakdown voltage of the Si substrate in the longitudinal direction contributes little to the breakdown voltage of the semiconductor device in the longitudinal direction.

Detection of such a carrier layer at the interface between the nitride semiconductor and the Si substrate might have been enabled by an improvement in a crystal growth technique of a nitride semiconductor layer on a Si substrate. The reason may be as follows. The improvement in the crystal growth technique enabled the growth of a nitride semiconductor with high crystallinity on a Si substrate. This causes a rapid change in the composition in a narrow range at the interface between the Si substrate and the nitride semiconductor layer to improve steepness of the surface level, thereby forming a carrier layer.

A semiconductor device with an improved breakdown voltage in the longitudinal direction by reducing an influence of a current path formed at the interface between a nitride semiconductor layer and a Si substrate will be described in detail with reference to embodiments.

FIRST EMBODIMENT

Figure 1B:
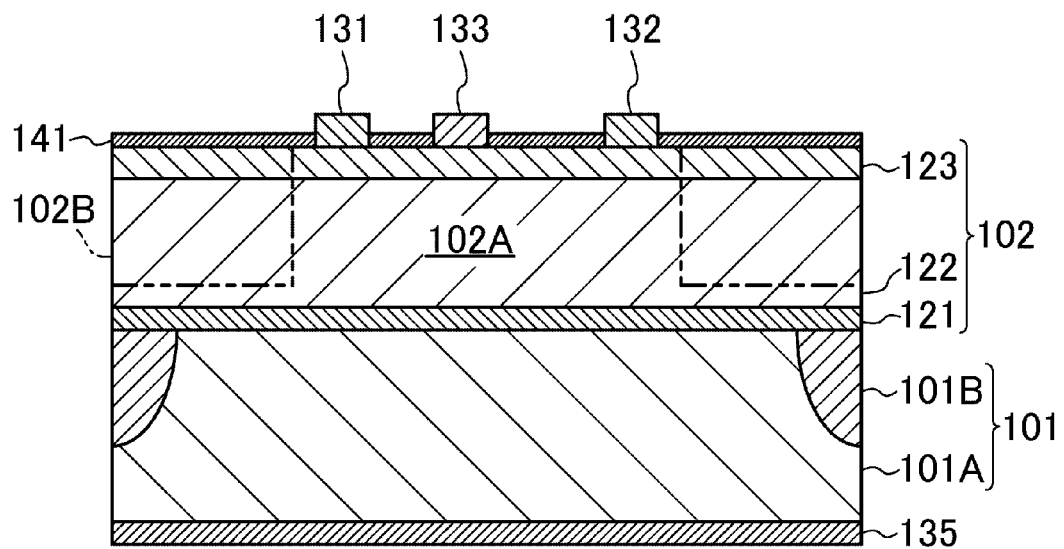

FIGS. 1A and 1B illustrate a semiconductor device according to a first embodiment. FIG. 1A illustrates a structure viewed from above. FIG. 1B illustrates a cross-sectional structure taken along the line Ib-Ib of FIG. 1A. As shown in FIGS. 1A and 1B, the semiconductor device of this embodiment is a heterostructure field effect transistor (HFET), and includes a semiconductor substrate 101, and a nitride semiconductor layer 102 formed on the semiconductor substrate 101. In this embodiment, the semiconductor substrate 101 is a p-type Si substrate of which the principal surface is a (111) plane. The nitride semiconductor layer 102 includes a buffer layer 121, a channel layer 122, and a cap layer 123, which are sequentially formed on the principal surface of the semiconductor substrate 101. The buffer layer 121 is made of, for example, AlN which is nitride semiconductor. The channel layer 122 is made of, for example, undoped GaN with a thickness of 1 μm. The cap layer 123 is made of, for example, undoped AlGaN with a thickness of 25 nm. The cap layer 123 may have an Al composition of about 25%.

The nitride semiconductor layer 102 includes an element region 102A, and an isolation region 102B formed to surround the element region 102A. The isolation region 102B is formed to reach a position lower than the interface between the cap layer 123 and the channel layer 122, and has higher resistance than the element region 102A. The isolation region 102B is formed, for example, by ion-implanting nonconductive impurities such as argon.

A source electrode 131, a drain electrode 132, and a gate electrode 133 are formed on the element region 102A. The source electrode 131 and the drain electrode 132 forms an ohmic contact with a two-dimensional electron gas layer formed at the interface between the cap layer 123 and the channel layer 122. The source electrode 131 and the drain electrode 132 may be, for example, multilayer films of titanium and aluminum etc. The gate electrode 133 forms a Schottky contact with the cap layer 123. The gate electrode 133 may be, for example, a multilayer film of nickel and gold. The gate electrode 133 is formed to intersect the element region 102A, and to cross the isolation region 102B. The source electrode 131 and the drain electrode 132 may have similar structures.

Figure 2A:
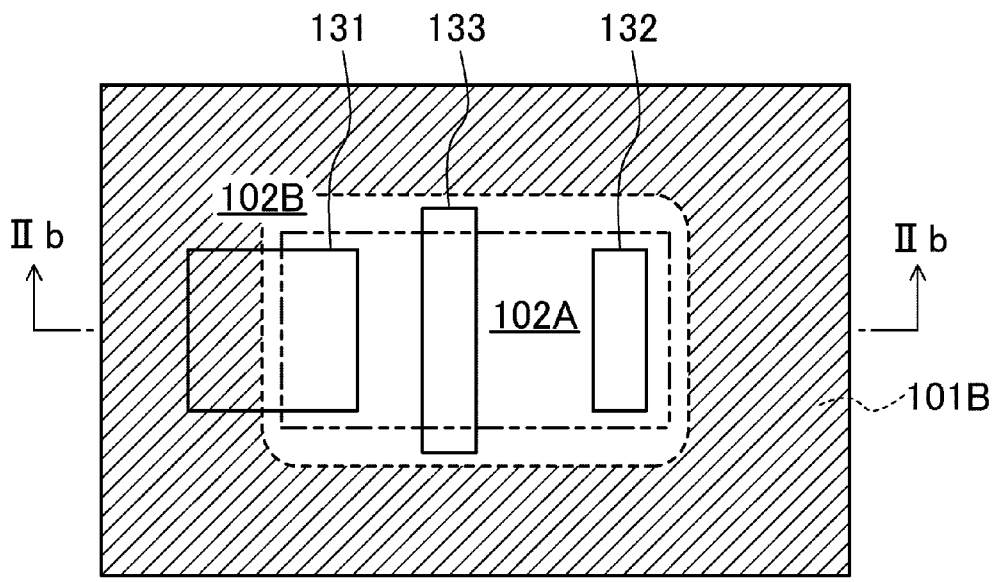
FIGS. 2A and 2B illustrate a semiconductor device according to a variation of the first embodiment.
Figure 2B:
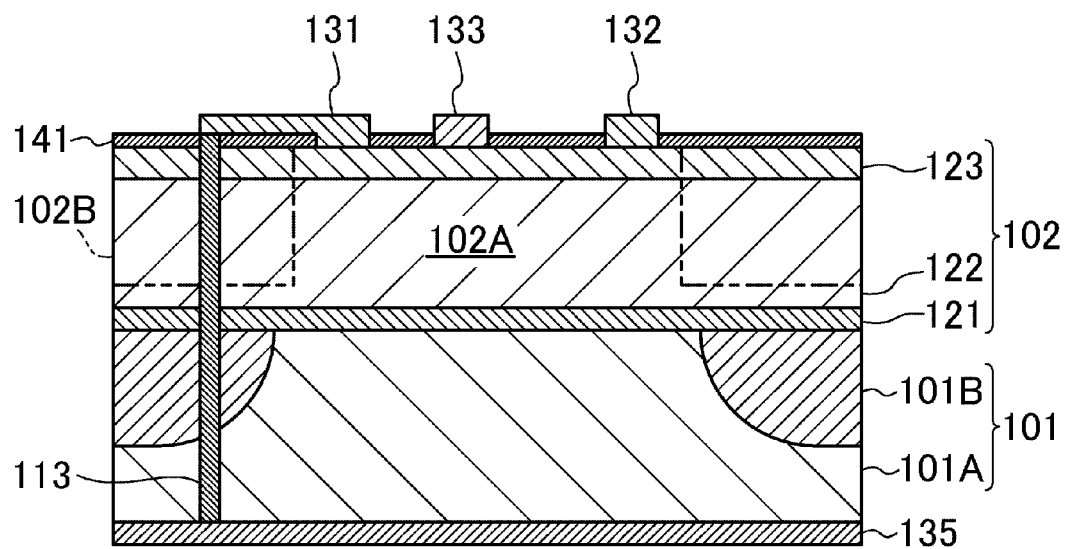

A passivation film 141 made of silicon nitride (SiN) with a thickness of 200 nm is formed to cover the surface of the nitride semiconductor layer 102. A back surface electrode 135 made of aluminum etc. is formed on a surface (back surface) of the semiconductor substrate 101 opposite to the nitride semiconductor layer 102. The back surface electrode 135 is connected to the source electrode 131 via an interconnect (not shown) etc. Note that, as shown in FIGS. 2A and 2B, the through electrode 113 penetrating the nitride semiconductor layer 102 and the semiconductor substrate 101 may be formed to connect the source electrode 131 to the back surface electrode 135.

The semiconductor substrate 101 includes a normal region 101A and an interface current block region 101B. The interface current block region 101B contains p-type impurities with higher concentration than those in the normal region 101A. In FIGS. 1A and 1B, the interface current block region 101B is in contact with the buffer layer 121. It surrounds the element region 102A, and is exposed to the side surface of the semiconductor substrate 101. Note that, where the through electrode 113 is formed, the through electrode 113 may be formed, as shown in FIGS. 2A and 2B, in the nitride semiconductor layer 102 to penetrate the isolation region 102B so that the through electrode 113 is isolated from a channel. Note that the through electrode 113 is not necessarily isolated from the channel. The through electrode 113 is preferably formed in the semiconductor substrate 101 to penetrate the interface current block region 101B.

Next, the operation of the semiconductor device of this embodiment will be described. Assume that where the source electrode 131 is connected to the back surface electrode 135, and a positive voltage is applied to the drain electrode 132 with respect to the potential of the source electrode 131. In this case, when a negative voltage is applied to the gate electrode 133, an HFET is turned off and an electric field is formed from the drain electrode 132 toward the semiconductor substrate 101. This forms an electron inversion layer at the interface between the p-type semiconductor substrate 101 and the buffer layer 121. The interface current block region 101B containing highly concentrated p-type impurities serves as a potential barrier against electrons. This reduces formation of a current path at the interface between the buffer layer 121 and the semiconductor substrate 101 so that no current can reach the surface of the semiconductor substrate 101. As a result, a leakage current flows to penetrate the semiconductor substrate 101 in the longitudinal direction, and the breakdown voltage of the semiconductor substrate 101 in the longitudinal direction contributes to the breakdown voltage of the semiconductor device in the longitudinal direction. Therefore, the breakdown voltage of the semiconductor device in the longitudinal direction can be largely improved.

Figure 3:
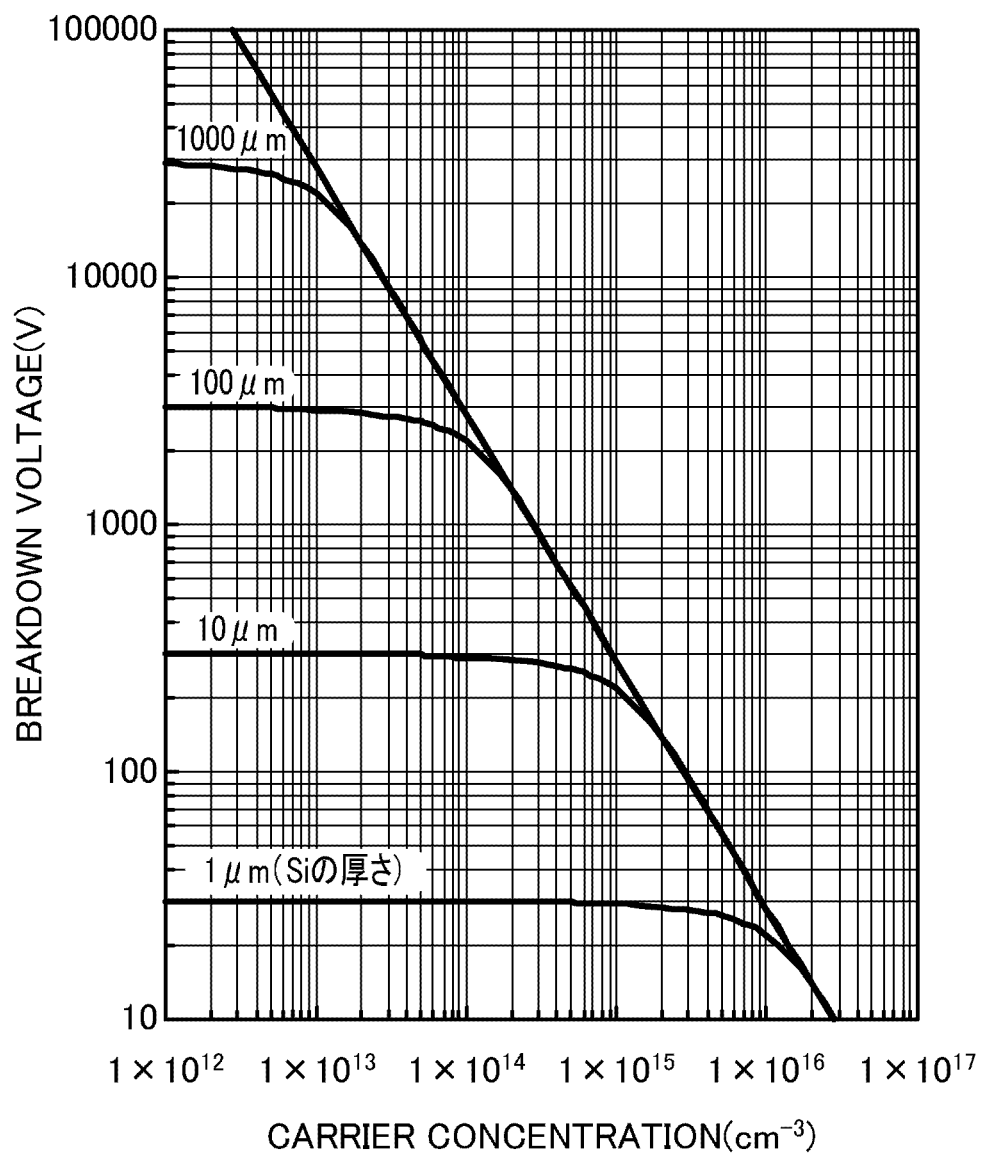
FIG. 3 is a graph illustrating a relationship between a carrier concentration and a breakdown voltage of a silicon substrate.

In the semiconductor device of this embodiment, the breakdown voltage of the semiconductor device in the longitudinal direction depends on the breakdown voltage of the nitride semiconductor layer 102 in the longitudinal direction and the breakdown voltage of the semiconductor substrate 101 in the longitudinal direction. Where the nitride semiconductor layer 102 has a uniform thickness, the breakdown voltage of the semiconductor device in the longitudinal direction increases with an increase in the breakdown voltage of the semiconductor substrate 101 in the longitudinal direction. The breakdown voltage of the semiconductor substrate 101 in the longitudinal direction depends on the thickness of the semiconductor substrate 101, and the concentration of impurities contained in the semiconductor substrate 101. FIG. 3 illustrates the relationship among the thickness, the impurity concentration, and the breakdown voltage of the Si substrate.

As shown in FIG. 3, the lower the impurity concentration of the semiconductor substrate 101 is, the higher the breakdown voltage of the semiconductor substrate 101 in the longitudinal direction is. Therefore, the impurity concentration of the semiconductor substrate 101 is preferably low. Where the semiconductor substrate 101 is a Si substrate, the impurity concentration preferably ranges from about $1 \times 10^{12}$ cm$^{-3}$ to about $1 \times 10^{16}$ cm$^{-3}$.

In the semiconductor device of this embodiment, the interface current block region 101B only needs to serve as a potential barrier against electrons. Thus, where the semiconductor substrate 101 is of the p type, the interface current block region 101B may contain p-type impurities at a higher concentration than the normal region 101A. Where the p-type impurities contained in the normal region 101A range from about $1 \times 10^{12}$ cm$^{-3}$ to about $1 \times 10^{16}$ cm$^{-3}$, the interface current block region 101B may have an impurity concentration of $1 \times 10^{16}$ cm$^{-3}$ or more. In order to improve the function as the potential barrier, it is preferably about $1 \times 10^{18}$ cm$^{-3}$ or more, and more preferably about $1 \times 10^{19}$ cm$^{-3}$ or more. The impurity concentration is preferably high but not higher than about $1 \times 10^{21}$ cm$^{-3}$, since an extremely high concentration makes ion implantation etc. difficult and influences crystallinity of the substrate etc.

The interface current block region 101B only needs to prevent a current, which flows inside the element region 102A in the longitudinal direction and reaches the interface between the nitride semiconductor layer 102 and the semiconductor substrate 101, from flowing through the interface between the nitride semiconductor layer 102 and the semiconductor substrate 101 in the lateral direction and reaching the side surface of the semiconductor substrate 101. Thus, the interface current block region 101B may be formed to surround the element region 102A. Furthermore, in view of the expansion of the current in the nitride semiconductor layer 102, the interface current block region 101B preferably reaches the side surface of the semiconductor substrate 101. In order to form a path for a current flowing through the semiconductor substrate 101 in the longitudinal direction, the interface current block region 101B is preferably not formed directly under the element region 102A, and the portion is preferably the normal region 101A. Note that "directly under the element region 102A" is the position under the element region 102A which overlaps the element region 102A when viewed from above. However, the portion directly under the element region 102A may be partially the interface current block region 101B.

Note that when the through electrode 113 is formed and a current having reached the interface between the nitride semiconductor layer 102 and the semiconductor substrate 101 reaches the through electrode 113, the current could flow in the longitudinal direction via the through electrode 113. Also, a current flowing through the through electrode 113 in the longitudinal direction could flow in the lateral direction at the interface between the nitride semiconductor layer 102 and the semiconductor substrate 101. However, in FIGS. 2A and 2B, the through electrode 113 is surrounded by the interface current block region 101B on the upper surface of the semiconductor substrate 101. This prevents the current, which flows through the interface between the nitride semiconductor layer 102 and the semiconductor substrate 101 in the lateral direction, from reaching the through electrode 113. This also reduces flow of the current from the through electrode 113 in the lateral direction at the interface between the nitride semiconductor layer 102 and the semiconductor substrate 101.

The boundary between the interface current block region 101B and the normal region 101A preferably has no edge to reduce regional concentration of the electric field. For example, as shown in FIG. 1A, the boundary preferably has a rectangular shape with curved corners by rounding edges, a rounded rectangular, an oval, or the like, when viewed from above. As shown in FIG. 1B, the boundary between the interface current block region 101B and the normal region 101A preferably has a cross-section being a rectangular shape with curved corners by rounding edges, an oval sector, or the like. However, the boundary between the interface current block region 101B and the normal region 101A may have a shape with edges.

Figure 4A:
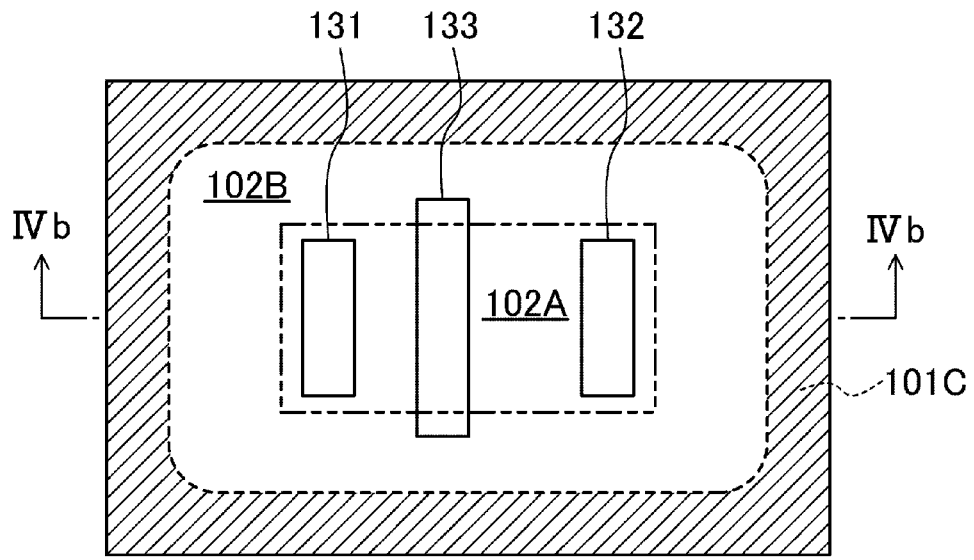
FIGS. 4A and 4B illustrate a semiconductor device according to a variation of the first embodiment.
Figure 4B:
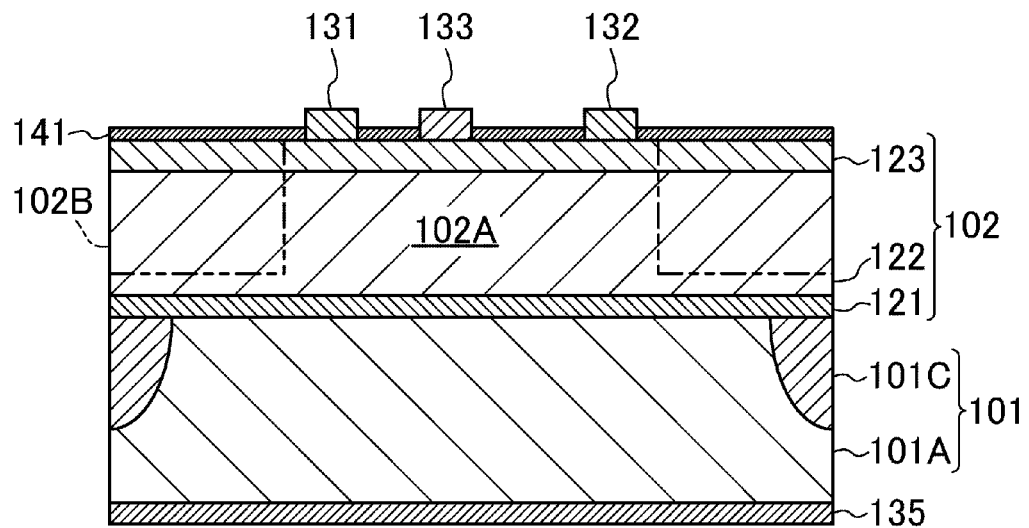
Figure 5A:
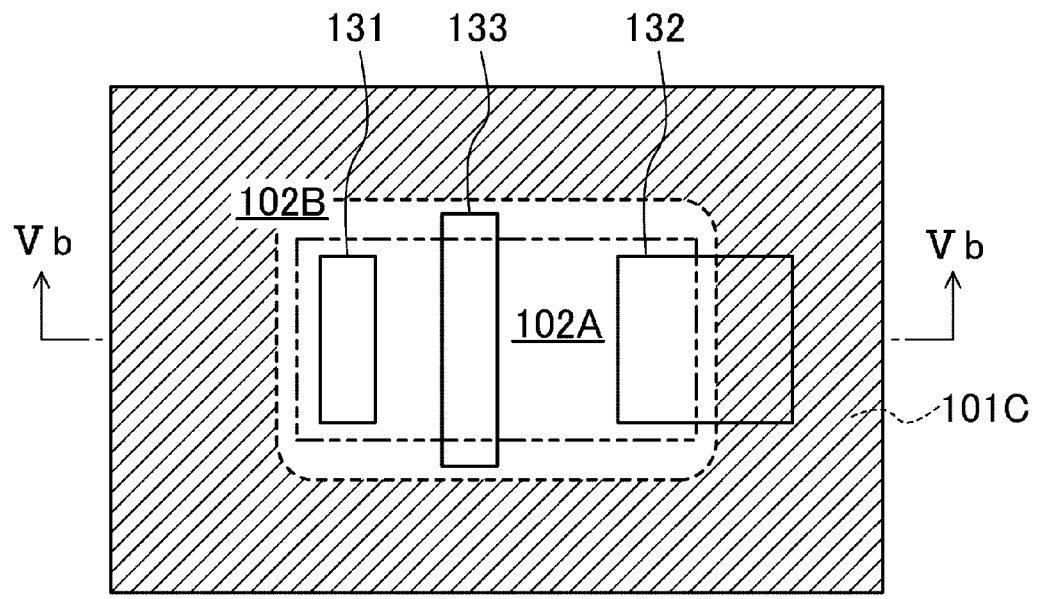
FIGS. 5A and 5B illustrate a semiconductor device according to a variation of the first embodiment.
Figure 5B:
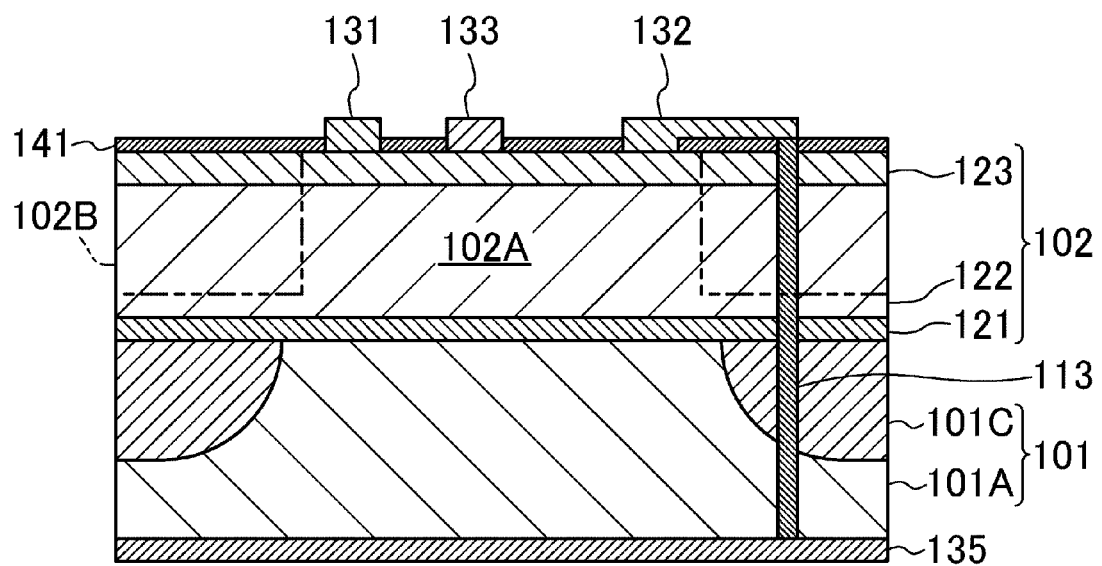

In this embodiment, an example has been described where a positive voltage is applied to the drain electrode 132. However, depending on the use of the semiconductor device, a negative voltage may be applied to the drain electrode 132 with respect to the potential of the source electrode 131, with a channel between the source electrode 131 and the drain electrode 132 closed. In this case, an electric field is formed from the semiconductor substrate 101 toward the drain electrode 132. This forms a hole accumulation region (layer?) at the interface between the buffer layer 121 and the semiconductor substrate 101. Thus, in order to reduce formation of a current path at the interface between the buffer layer 121 and the semiconductor substrate 101, an interface current block region 101C containing n-type impurities and serving as a potential barrier against holes may be formed, as shown in FIGS. 4A and 4B. In this case, as shown in FIGS. 5A and 5B, the through electrode 113 connecting the drain electrode 132 to the back surface electrode 135 may be formed.

The concentration of the n-type impurities in the interface current block region 101C may be in any range as long as a potential barrier can be formed, and may be $1\times10^{16}$ cm$^{-3}$ or more. Furthermore, in order to improve the function as the potential barrier, it is preferably about $1\times10^{18}$ cm$^{-3}$ or more, and more preferably about $1\times10^{19}$ cm$^{-3}$ or more. The impurity concentration is preferably high but not higher than about $1\times10^{21}$ cm$^{-3}$, since an extremely high concentration influences crystallinity of the substrate etc.

Figure 6A:
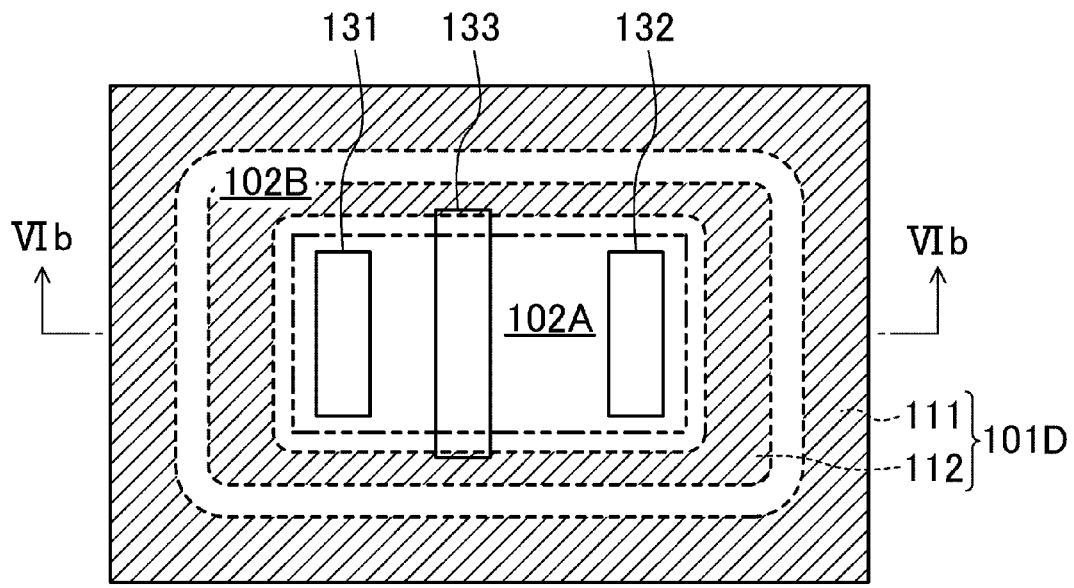
FIGS. 6A and 6B illustrate a semiconductor device according to a variation of the first embodiment.
Figure 6B:
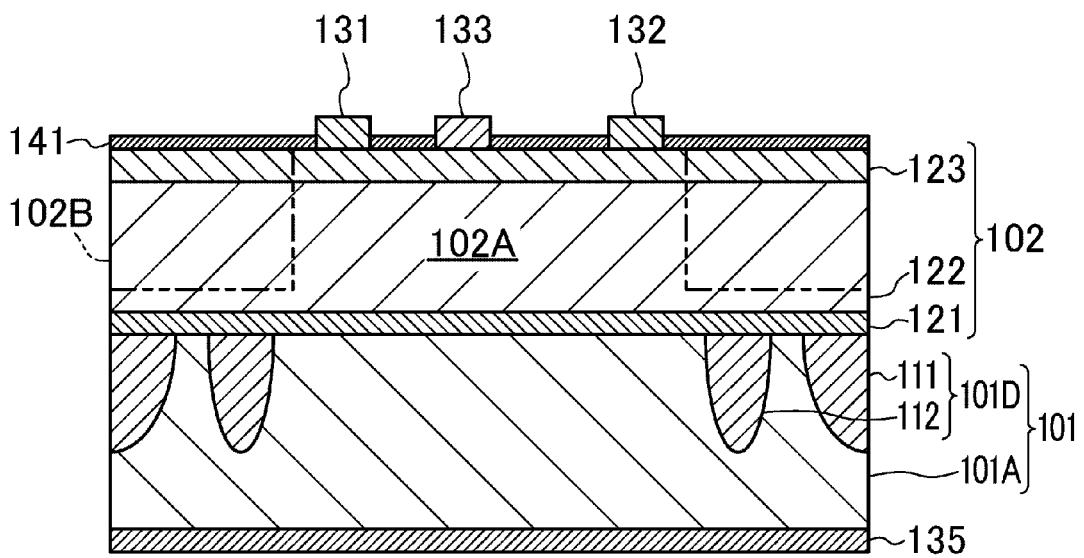
Figure 7A:
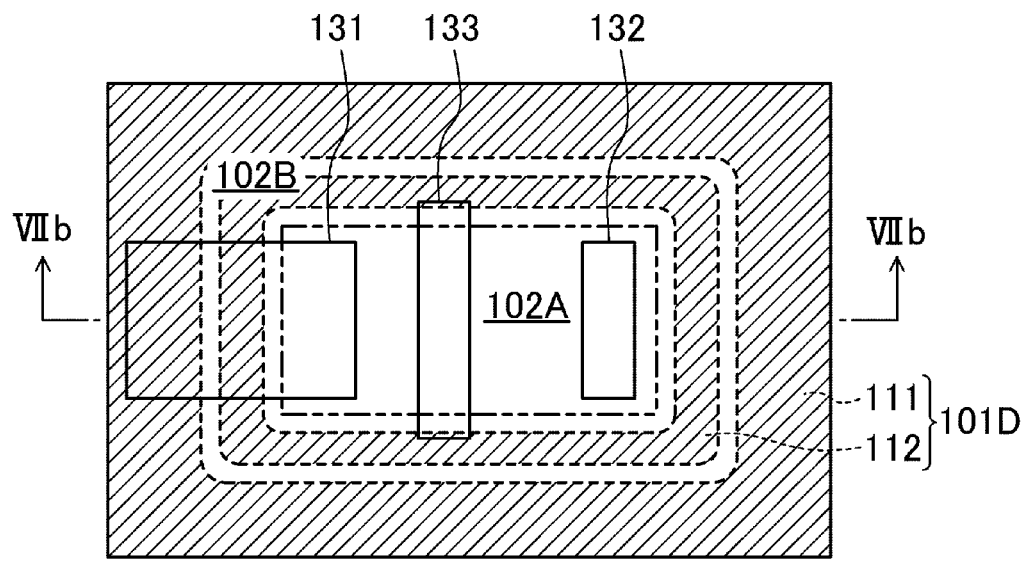
FIGS. 7A and 7B illustrate a semiconductor device according to a variation of the first embodiment.
Figure 7B:
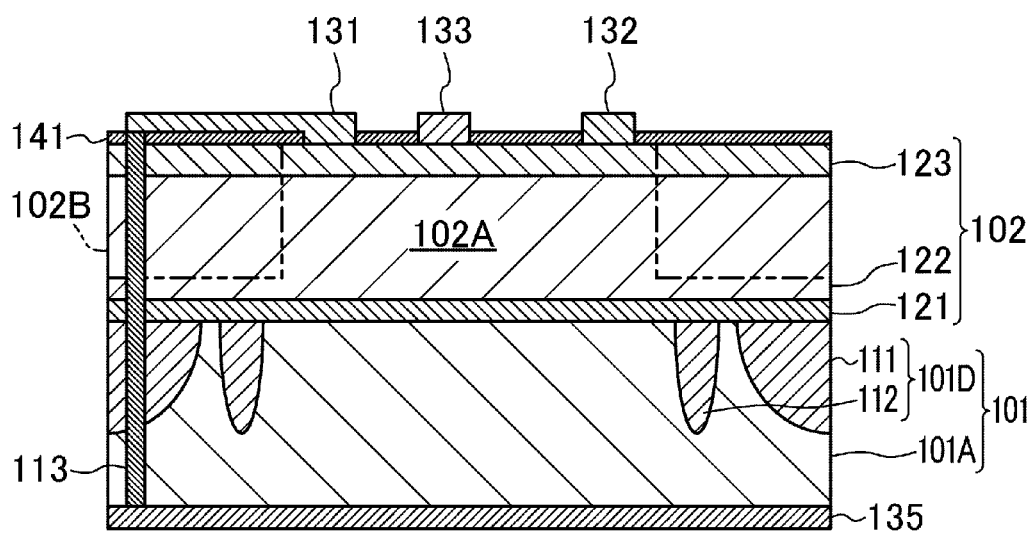
Figure 8A:
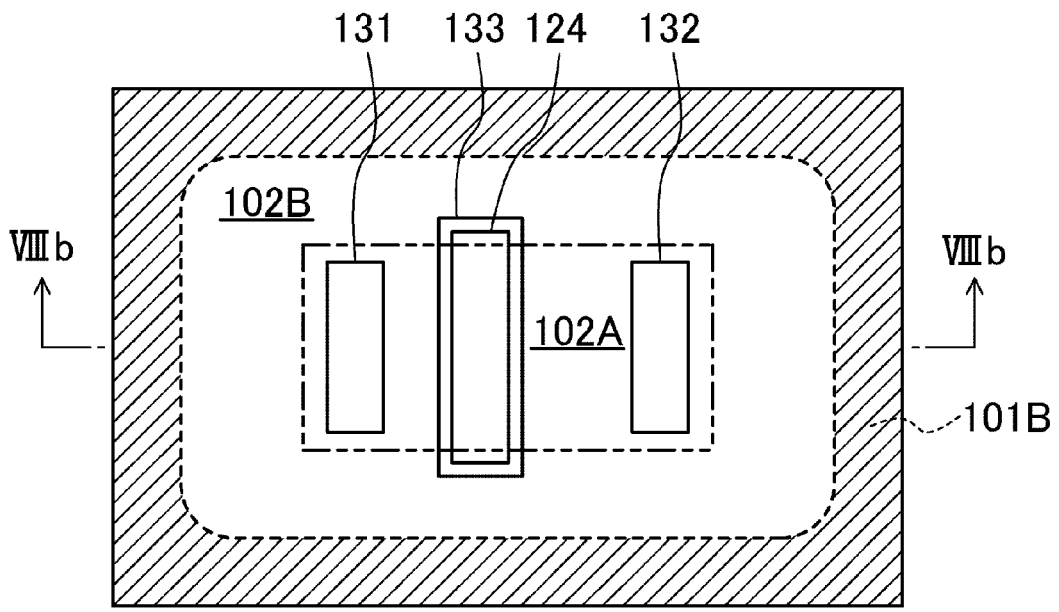
FIGS. 8A and 8B illustrate a semiconductor device according to a variation of the first embodiment.
Figure 8B:
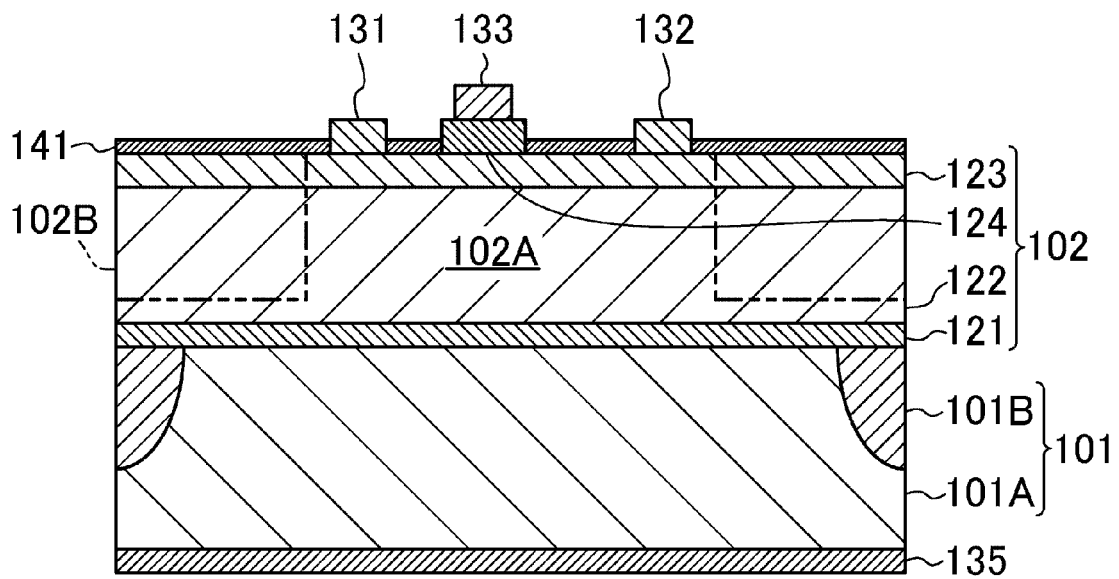
Figure 9A:
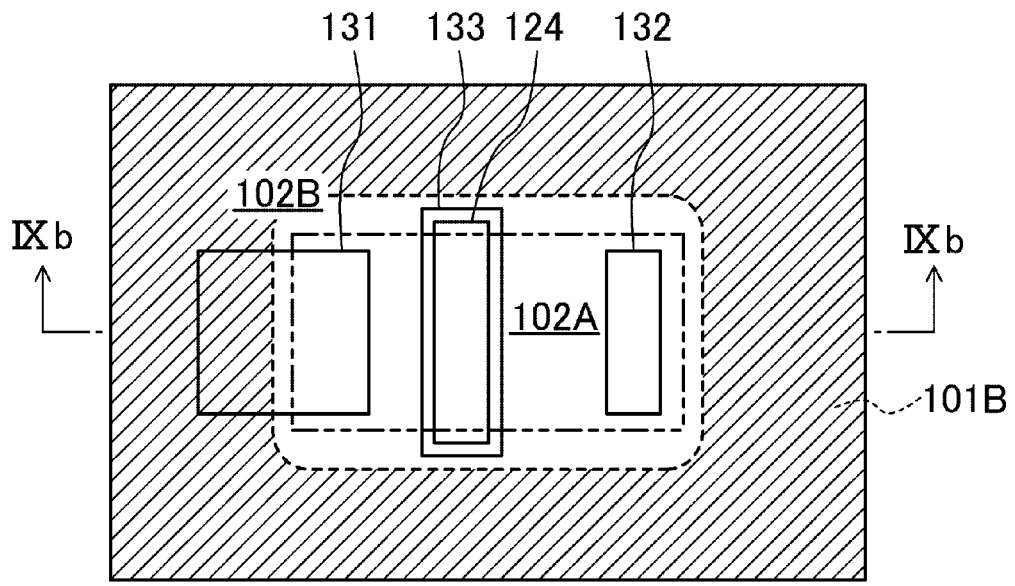
FIGS. 9A and 9B illustrate a semiconductor device according to a variation of the first embodiment.
Figure 9B:
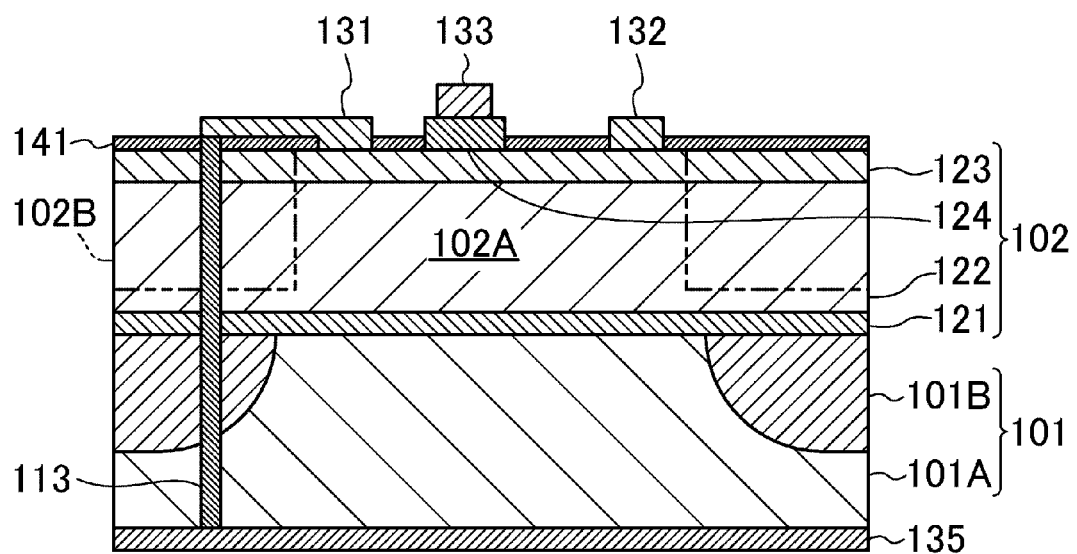

An operation is occasionally required to switch between the states where a positive voltage is applied to the drain electrode 132, and where a negative voltage is applied to the drain electrode 132. In this case, as shown in FIGS. 6A and 6B, an interface current block region 101D may be formed, which includes a first region 111 containing p-type impurities, and a second region 112 containing n-type impurities. The first region 111 servers as a potential barrier against electrons, and the second region 112 servers as a potential barrier against holes. Therefore, in both the states where the positive voltage is applied to the drain electrode 132 and where the negative voltage is applied to the drain electrode 132, formation of a current path at the interface between the buffer layer 121 and the semiconductor substrate 101 can be reduced. In this case as well, as shown in FIGS. 7A and 7B, the through electrode 113 may be formed. In FIGS. 7A and 7B, the through electrode 113 is surrounded by the first region 111, which is formed at an outer side on the upper surface of the semiconductor substrate 101. This reduces flow of the current from the through electrode 113 in the lateral direction at the interface between the nitride semiconductor layer 102 and the semiconductor substrate 101.

The first region 111 is preferably spaced apart from the second region 112. By spacing the first region 111 apart from the second region 112, flow of a tunnel current at the interface between the first region 111 and the second region 112 can be reduced.

While in FIGS. 6A, 6B, 7A, and 7B, an example has been described where the first region 111 is formed outside the second region 112, the second region 112 may be formed outside the first region 111. In this case, the through electrode 113 may be surrounded by the second region which is formed at an outer side.

While in FIGS. 6A, 6B, 7A, and 7B, an example has been described where the single first region 111 and the single second region 112 are formed, a plurality of first regions 111 and a plurality of second regions 112 may be alternately formed. In this case, the through electrode 113 may be surrounded by the outermost first region and the outermost second region.

While in this embodiment, an example has been described where the semiconductor substrate 101 is of the p type, the semiconductor substrate 101 may be of the n type. Where the semiconductor substrate 101 is of the n type, an electron accumulation layer is formed at the interface between the buffer layer 121 and the semiconductor substrate 101 upon application of a positive voltage to the drain electrode 132 with respect to the potential of the source electrode 131. Thus, by forming a p-type interface current block region, a current path is hardly formed at the interface between the buffer layer 121 and the semiconductor substrate 101. On the other hand, when a negative voltage is applied to the drain electrode 132 with respect to the potential of the source electrode 131, a hole inversion layer is formed at the interface between the buffer layer 121 and the semiconductor substrate 101. Thus, by forming an n-type interface current block region, a current path is hardly formed at the interface between the buffer layer 121 and the semiconductor substrate 101. Where both a positive voltage and a negative voltage are applied to the drain electrode 132, both the p-type interface current block region and the n-type interface current block region may be formed.

In this embodiment, the gate electrode 133 forms a Schottky contact with the cap layer 123. However, as shown in FIGS. 8A, 8B, 9A, and 9B, a p-type nitride semiconductor layer 124 made of p-type GaN, AlGaN, etc. may be formed on the cap layer 123 and the gate electrode 133 may form an ohmic contact with the p-type nitride semiconductor layer 124. In this case, a normally off transistor can be formed.

Figure 10A:
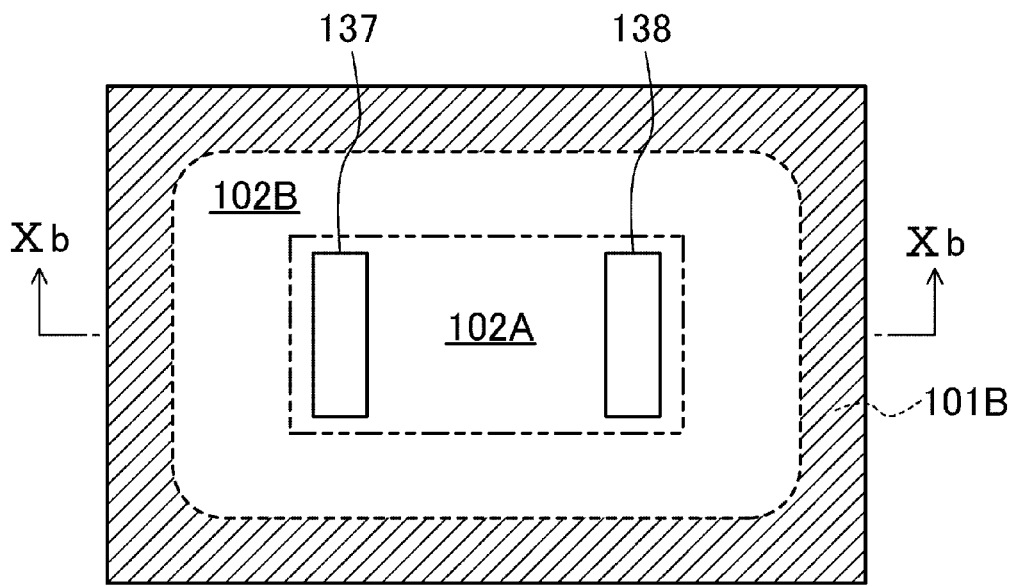
FIGS. 10A and 10B illustrate a semiconductor device according to a variation of the first embodiment.
Figure 10B:
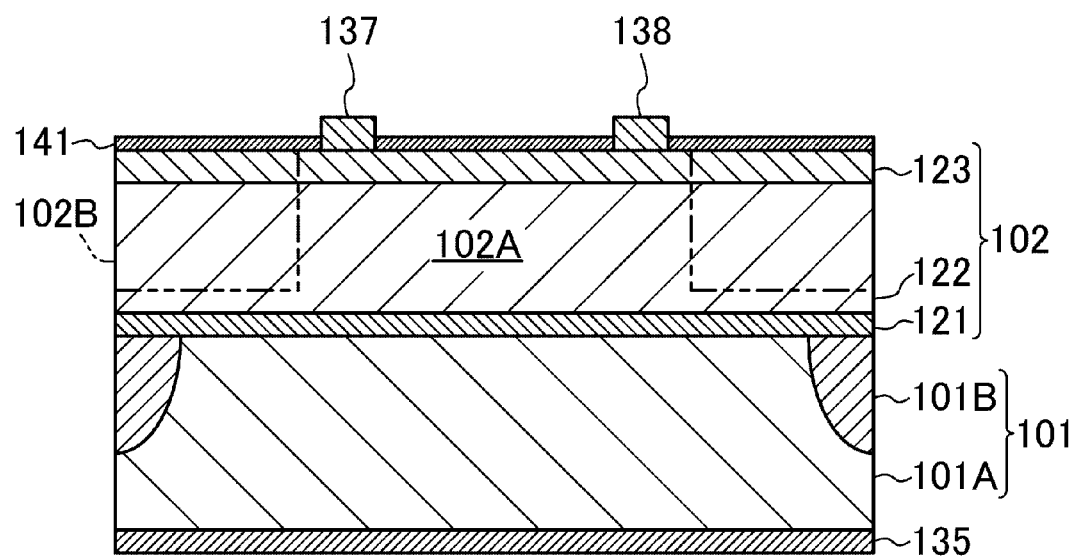
Figure 11A:
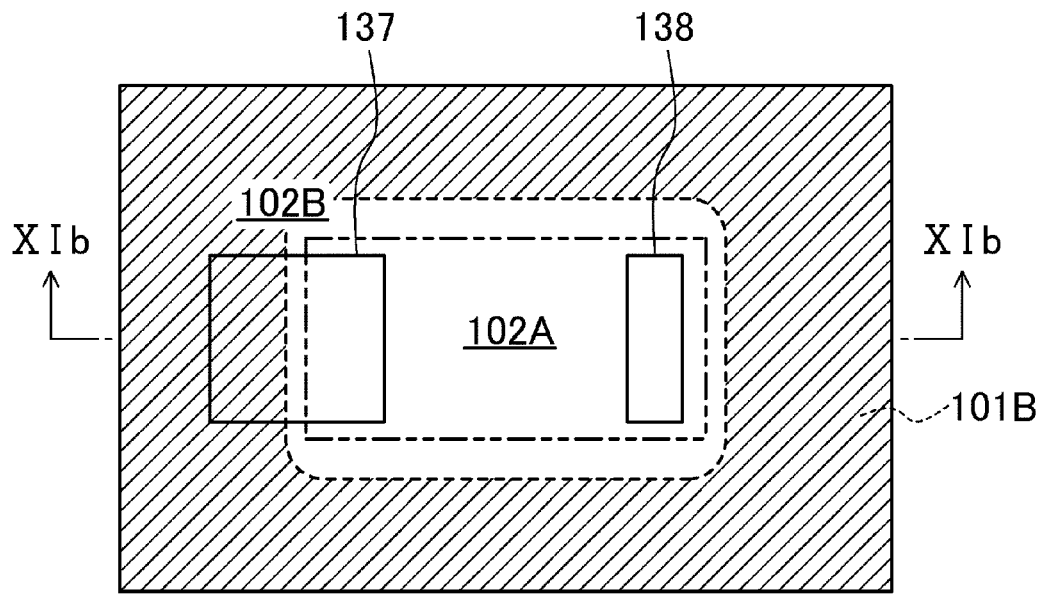
FIGS. 11A and 11B illustrate a semiconductor device according to a variation of the first embodiment.
Figure 11B:
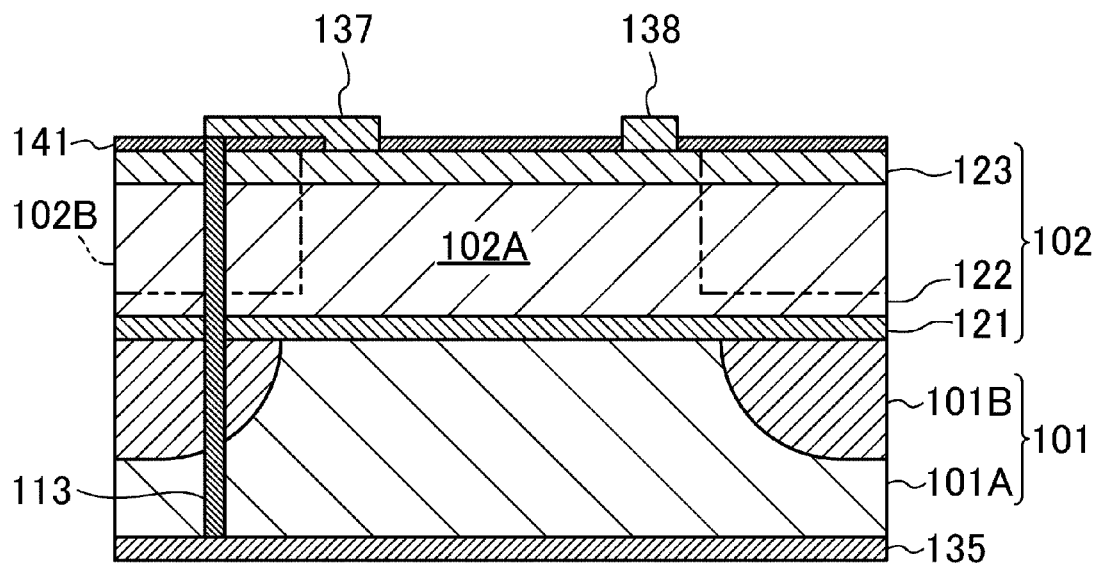
Figure 12A:
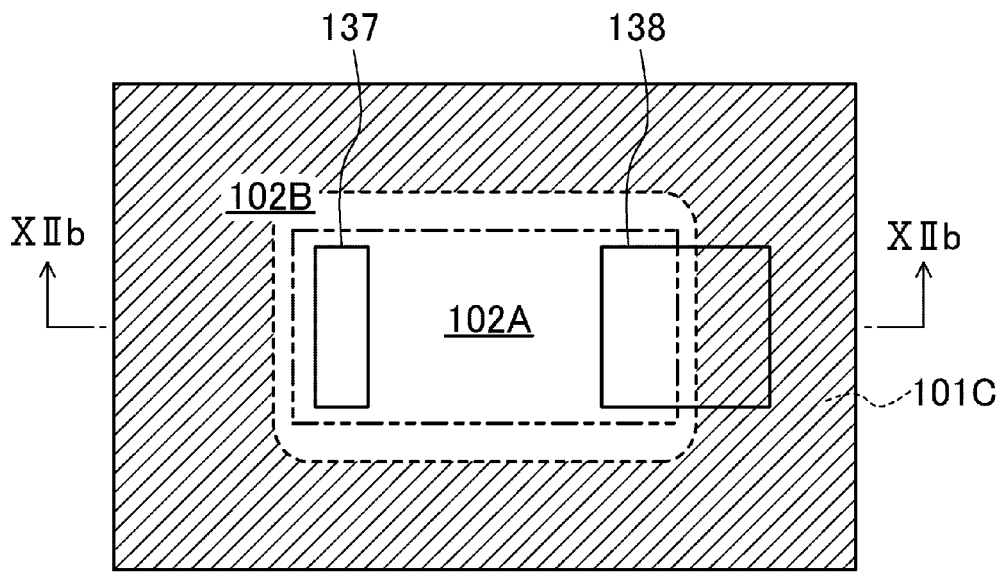
FIGS. 12A and 12B illustrate a semiconductor device according to a variation of the first embodiment.
Figure 12B:
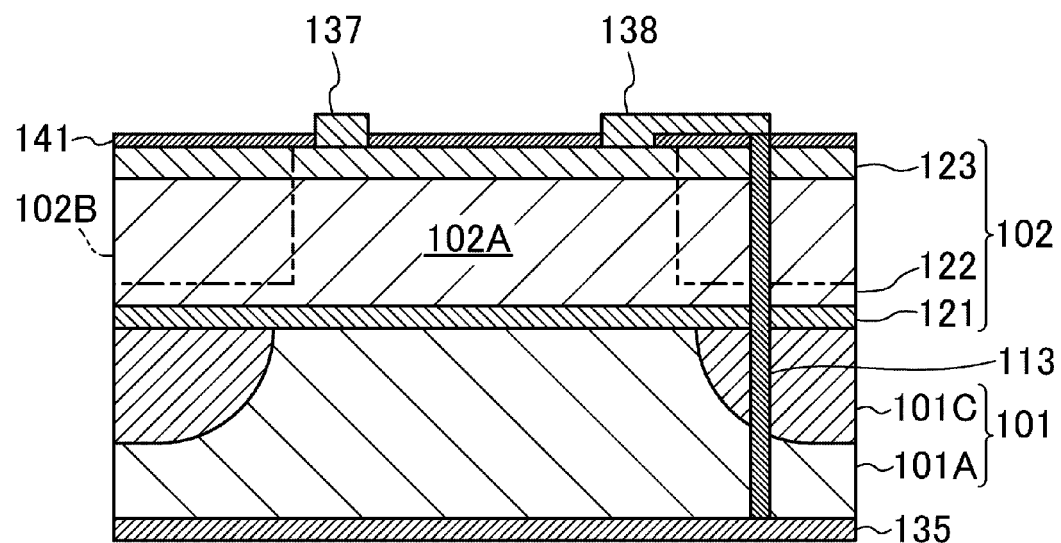

The semiconductor element formed on the semiconductor substrate is not limited to a transistor such as an HFET. For example, it may be a diode. In this case, as shown in FIGS. 10A and 10B, an anode electrode 137 and a cathode electrode 138 may be formed on the element region 102A. In this case, as shown in FIGS. 11A, 11B, 12A, and 12B, the through electrode 113 may be formed. Where the back surface electrode 135 is connected to the cathode electrode 138, the n-type interface current block region 101C may be formed. If an anode electrode is formed on the element region 102A with a p-type nitride semiconductor layer interposed therebetween, a pn junction diode can be formed.

The semiconductor element formed on the semiconductor substrate may be a vertical transistor, as shown in FIGS. 13A and 13B. The vertical transistor includes a nitride semiconductor layer 106 on the principal surface of the semiconductor substrate 101. The nitride semiconductor layer 106 includes a buffer layer 161, an undoped GaN layer 162, a first n-type GaN layer 163, a second n-type GaN layer 164, a p-type GaN layer 165, and a third n-type GaN layer 166, which are sequentially formed. The first n-type GaN layer 163 and the third n-type GaN layer 166 contain n-type impurities at a higher concentration than the second n-type GaN layer 164.

The third n-type GaN layer 166, the p-type GaN layer 165, the second n-type GaN layer 164, and the first n-type GaN layer 163 are partially removed, thereby forming a raised mesa. An isolation region 106B isolating an element region 106A is spaced apart from the mesa.

In the mesa, a recess is provided, which is formed by partially removing the third n-type GaN layer 166, the p-type GaN layer 165, the second n-type GaN layer 164, and the first n-type GaN layer 163. A SiN film 171 functioning as a gate insulating film and a passivation film is formed to cover the nitride semiconductor layer 106. The gate electrode 133 is formed in the recess with the SiN film 171 interposed therebetween. The source electrode 131, which forms an ohmic contact with the third n-type GaN layer 166, is formed on the mesa on each side of the gate electrode 133. The drain electrode 132, which is the ohmic contact with the first n-type GaN layer 163, is formed on the element region 106A on each side of the mesa.

When a positive voltage is applied to the gate electrode 133 with respect to the potential of the source electrode 131, an electron inversion layer is formed at the interface between the p-type GaN layer 165 and the SiN film 171, and a highly-concentrated electron accumulation layer is formed at the interface between the second n-type GaN layer 164 and the SiN film 171. As a result, the source electrode 131 is connected to the drain electrode 132 by an electron channel, the transistor is turned on, and a drain current flows. In place of the SiN film 171, an aluminum oxide ($Al_2O_3$) film, a hafnium dioxide ($HfO_2$) film, etc. may be used.

Figure 14A:
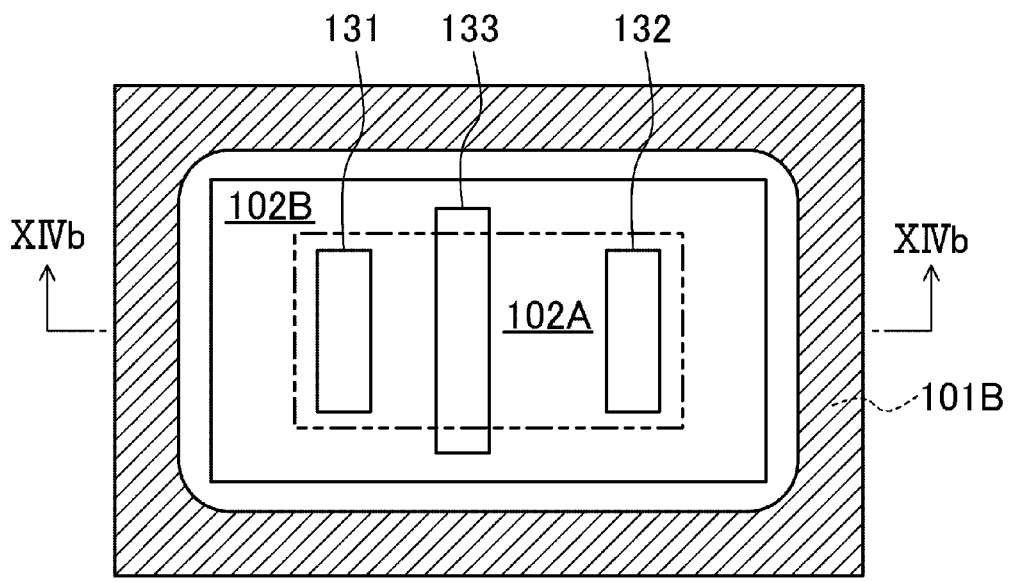
FIGS. 14A and 14B illustrate a semiconductor device according to a variation of the first embodiment.
Figure 14B:
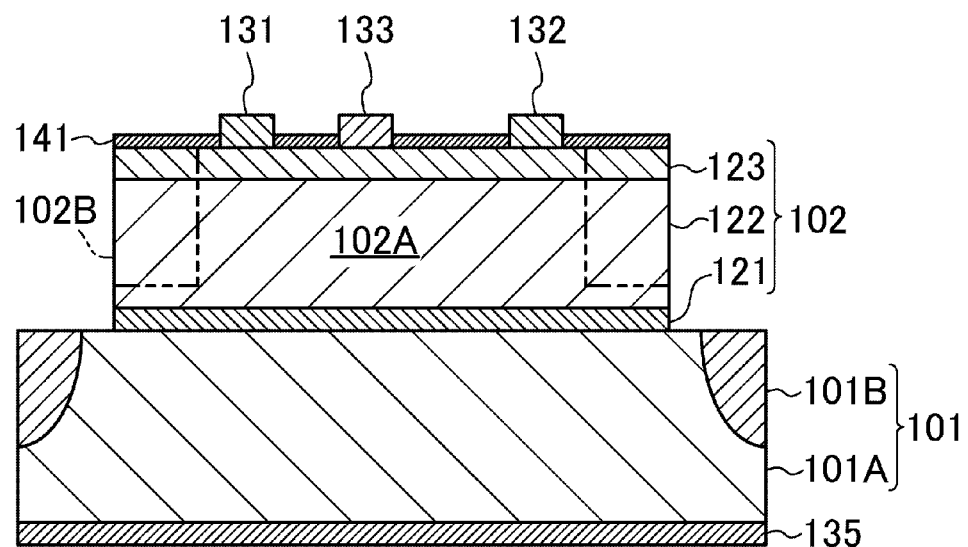

The semiconductor device of this embodiment reduces formation of a current path at the interface between the nitride semiconductor layer and the semiconductor substrate. However, where the nitride semiconductor layer is a multilayer, a current path could be formed inside the nitride semiconductor layer. FIGS. 14A and 14B show an example where the nitride semiconductor layer 102 is selectively removed to expose the outer edge of the semiconductor substrate 101. This structure reduces flow of a leakage current into the side surface of the semiconductor substrate 101 not only via a current path at the interface between the buffer layer 121 and the semiconductor substrate 101 but also via a current path at the interface between the channel layer 122 and the buffer layer 121. This further efficiently improves the breakdown voltage of the semiconductor device in the longitudinal direction. Note that the vertical transistor shown in FIGS. 13A and 13B may have a similar structure.

Figure 15A:
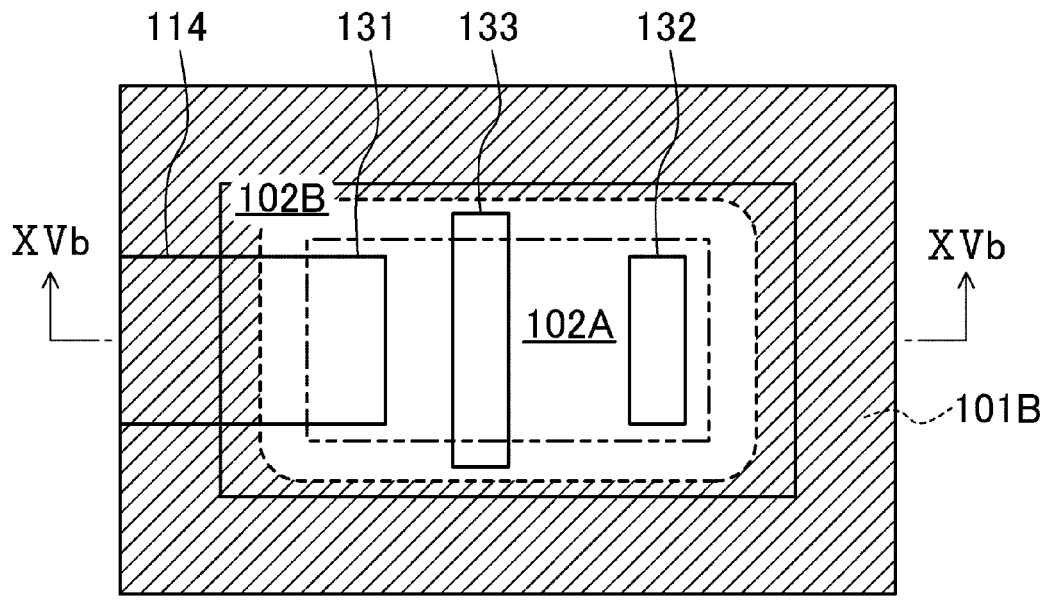
FIGS. 15A and 15B illustrate a semiconductor device according to a variation of the first embodiment.
Figure 15B:
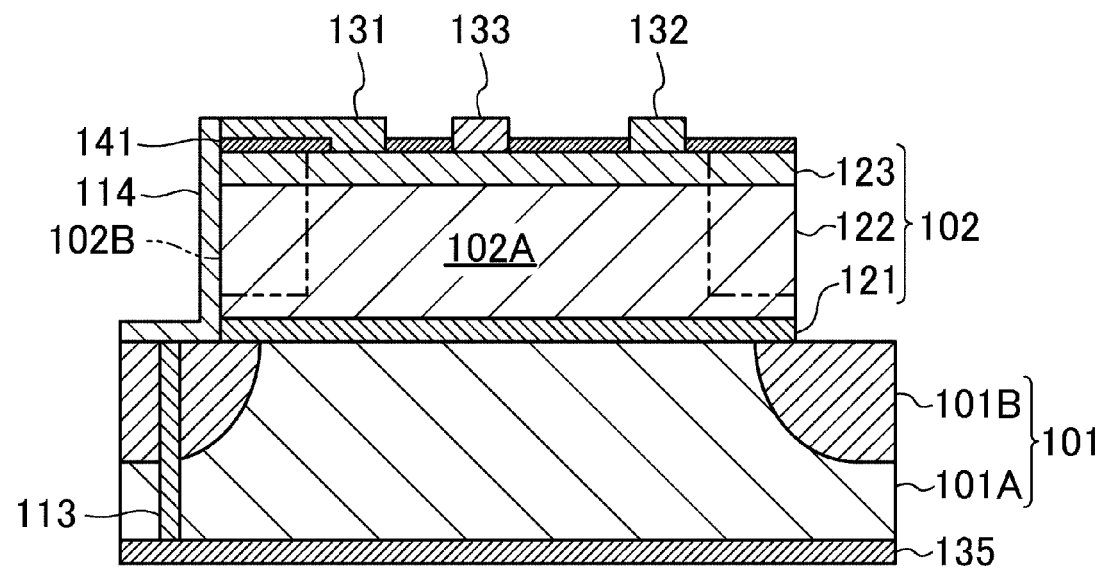

In FIGS. 14A and 14B, the nitride semiconductor layer 102 is physically isolated, the isolation region 102B may not be formed. However, if the isolation region 102B is formed, a leakage current flowing through the side surface of the nitride semiconductor layer 102 can be reduced. Where a through electrode is formed, as shown in FIGS. 15A and 15B, the source electrode 131 is connected to the through electrode 113 by an interconnect 114 formed on the surface of the nitride semiconductor layer 102.

While in the examples shown in FIGS. 8A-15B, the interface current block region contains n-type or p-type impurities, it may include both a region containing n-type impurities and a region containing p-type impurities.

SECOND EMBODIMENT

Figure 16A:
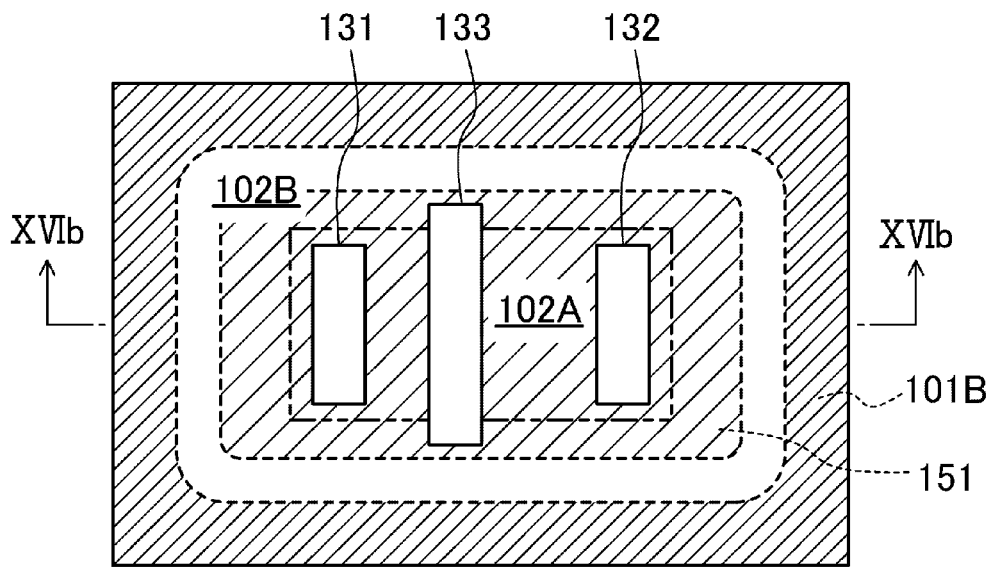
FIGS. 16A and 16B illustrate a semiconductor device according to a second embodiment.
Figure 16B:
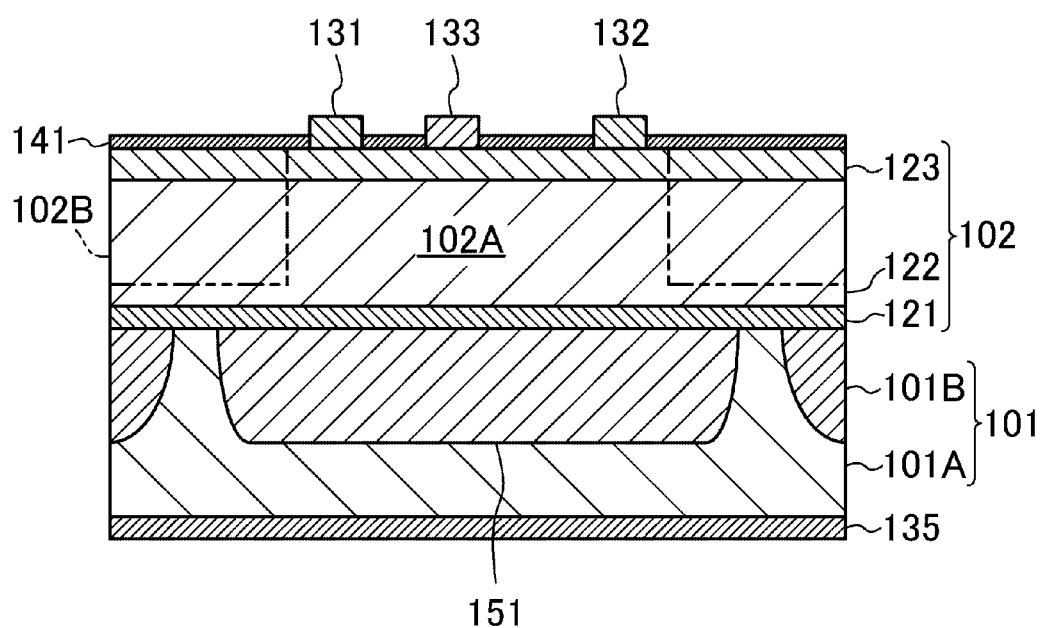

A second embodiment will be described hereinafter with reference to the drawings. FIGS. 16A and 16B illustrate a semiconductor device according to the second embodiment. FIG. 16A illustrates a structure viewed from above. FIG. 16B illustrates a cross-sectional structure. In FIGS. 16A and 16B, the same reference characters as those shown in FIG. 1 are used to represent equivalent elements, and the explanation thereof will be omitted.

In the semiconductor device of this embodiment, the semiconductor substrate 101 includes a depletion layer formation region 151. The depletion layer formation region 151 contains impurities of a different conductivity type from the semiconductor substrate 101. For example, where the semiconductor substrate 101 is of the p type, the depletion layer formation region 151 contains n-type impurities. As a result, the depletion layer formation region 151 and the normal region 101A form a pn junction diode.

Where the source electrode 131 is electrically connected to the back surface electrode 135, and a positive voltage is applied to the drain electrode 132 with respect to the potential of the source electrode 131, a reverse-direction voltage is applied to the pn junction diode by applying the voltage to the drain electrode 132. The reverse-direction voltage causes a thickness depletion layer at the interface between the depletion layer formation region 151 and the normal region 101A. This increases the breakdown voltage of the semiconductor substrate 101 in the longitudinal direction to further improve the breakdown voltage of the semiconductor device in the longitudinal direction.

The impurity concentration of the depletion layer formation region 151 is not limited as long as a pn junction diode can be formed. It is however, preferably about $1\times10^{16}$ cm$^{-3}$ or more. However, an extremely high impurity concentration influences crystallinity of the semiconductor substrate 101 etc., the concentration is preferably about $1\times10^{21}$ cm$^{-3}$ or less.

Figure 17A:
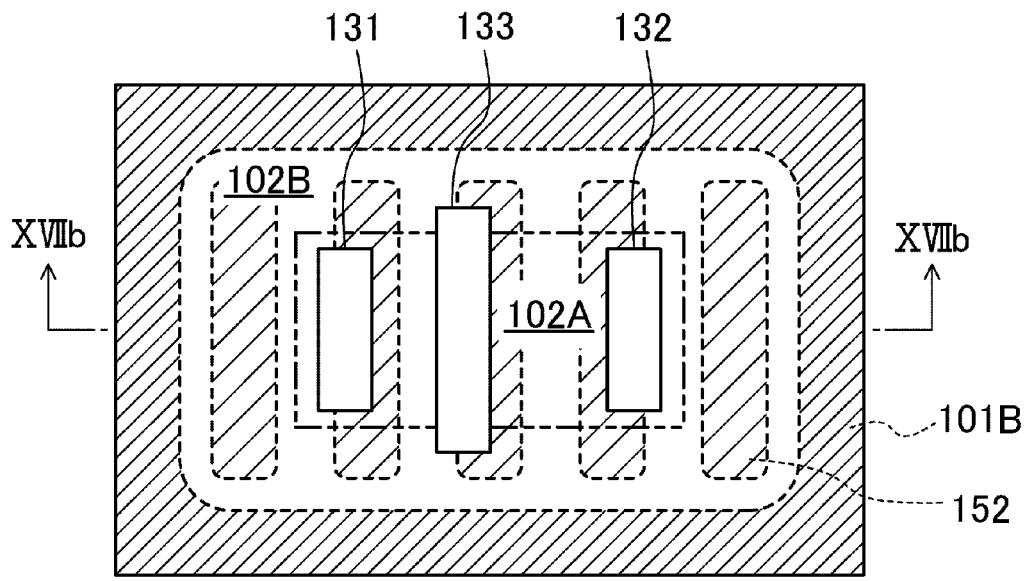
FIGS. 17A and 17B illustrate a semiconductor device according to a variation of the second embodiment.
Figure 17B:
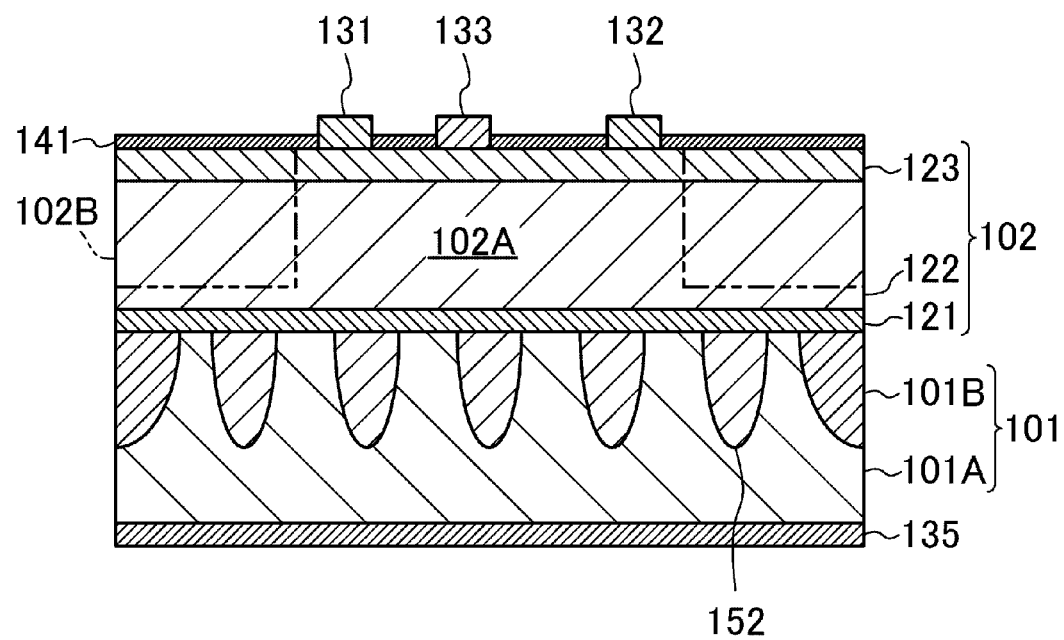
Figure 18A:
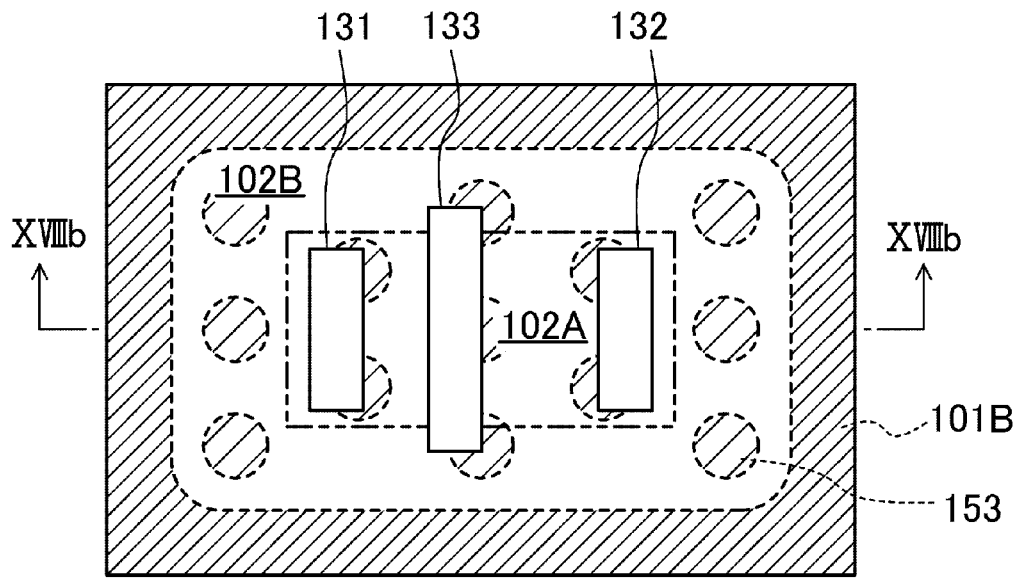
FIGS. 18A and 18B illustrate a semiconductor device according to a variation of the second embodiment.
Figure 18B:
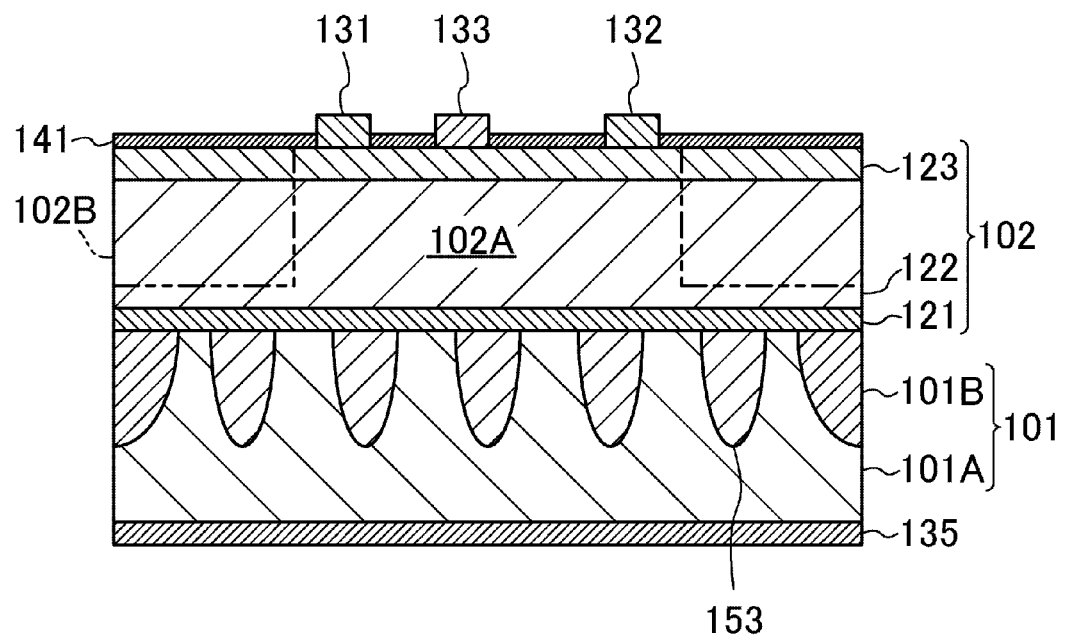

In FIGS. 16A and 16B, the depletion layer formation region 151 is larger than the element region 102A. The depletion layer formation region 151 is located directly under the element region 102A. However, all the portion directly under the element region 102A may not necessarily be the depletion layer formation region 152. Also, as shown in FIGS. 17A and 17B, a plurality of band-like depletion layer formation regions 152 may be formed at equal intervals. As shown in FIGS. 18A and 18B, insular depletion layer formation regions 153 are formed in a matrix. This enables expansion of the depletion layer not only in the vertical direction but also in the horizontal direction. This results in a further improvement in the breakdown voltage of the semiconductor device in the longitudinal direction. When the band-like depletion layer formation regions 152 or the insular depletion layer formation regions 153 are formed, the intervals may be controlled so that the depletion layers expanding from the depletion layer formation regions overlap each other.

While in this embodiment, an example has been described where the interface current block region 101B containing p-type impurities is formed. However, an interface current block region including a first region containing p-type impurities and a second region containing n-type impurities may be formed.

In order to reduce flow of a tunnel current between the depletion layer formation region and the interface current block region, the depletion layer formation region is preferably spaced apart from the interface current block region.

Where a negative voltage is applied to the drain electrode 132 with respect to the potential of the source electrode 131, the semiconductor substrate 101 may be of the n type, and the depletion layer formation region 151 is of the p type. In this case, the interface current block region may be of the n type or the combination of the n type and the p type.

In this embodiment, a p-type nitride semiconductor layer may be formed between a gate electrode and a cap layer. The semiconductor element formed on the semiconductor substrate may be a diode or a vertical transistor in place of an HFET. In order to reduce an influence of a current path formed between the buffer layer and the channel layer, the nitride semiconductor layer may be partially removed. Also, an example has been described where a transistor and a diode include a channel layer and a cap layer which are made of nitride semiconductor, the semiconductor element may be other types of transistor or diode. For example, it may be a bipolar transistor, a pn junction diode, a pin junction diode, etc. made of nitride semiconductor. Furthermore, a through electrode can be formed also in the second embodiment. For example, the through electrode may connect the source electrode to the back surface electrode.

Figure 19:
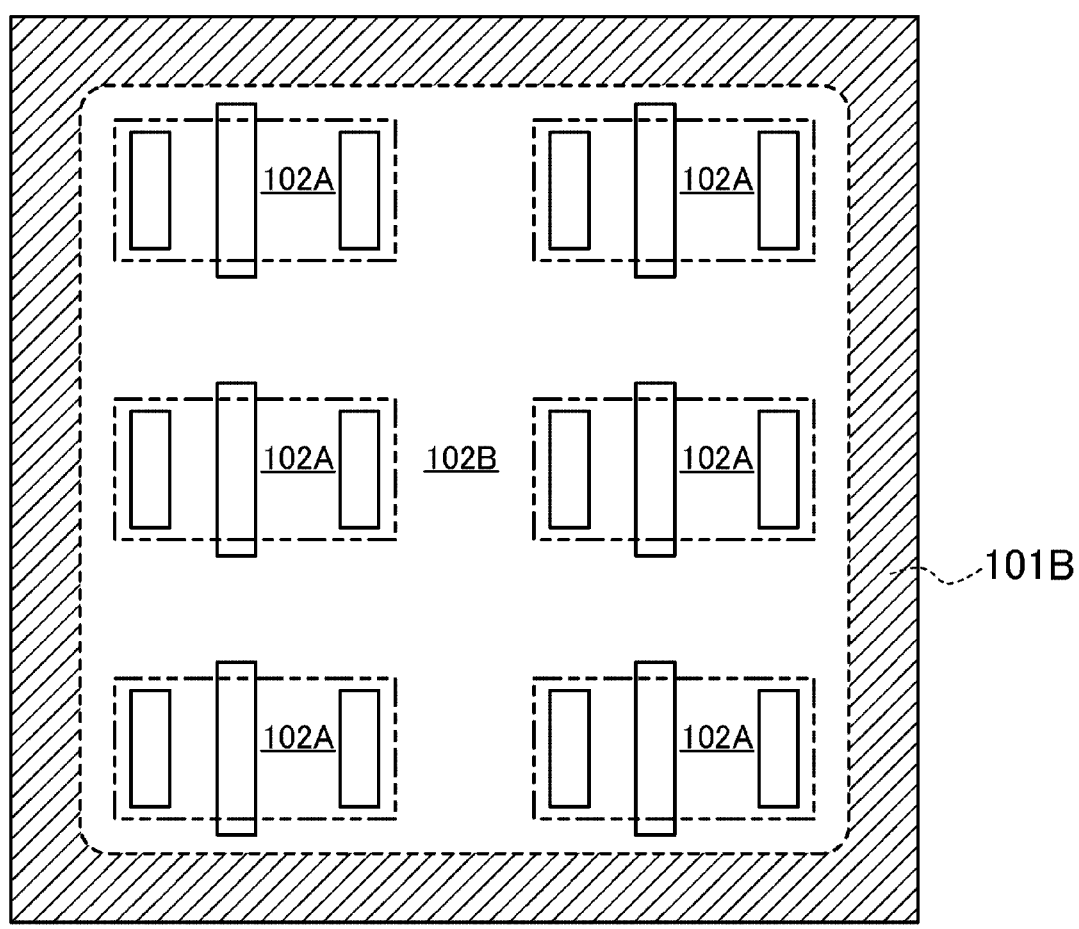
FIG. 19 is a top view illustrating a semiconductor device according to a variation of the first and second embodiments.
Figure 20:
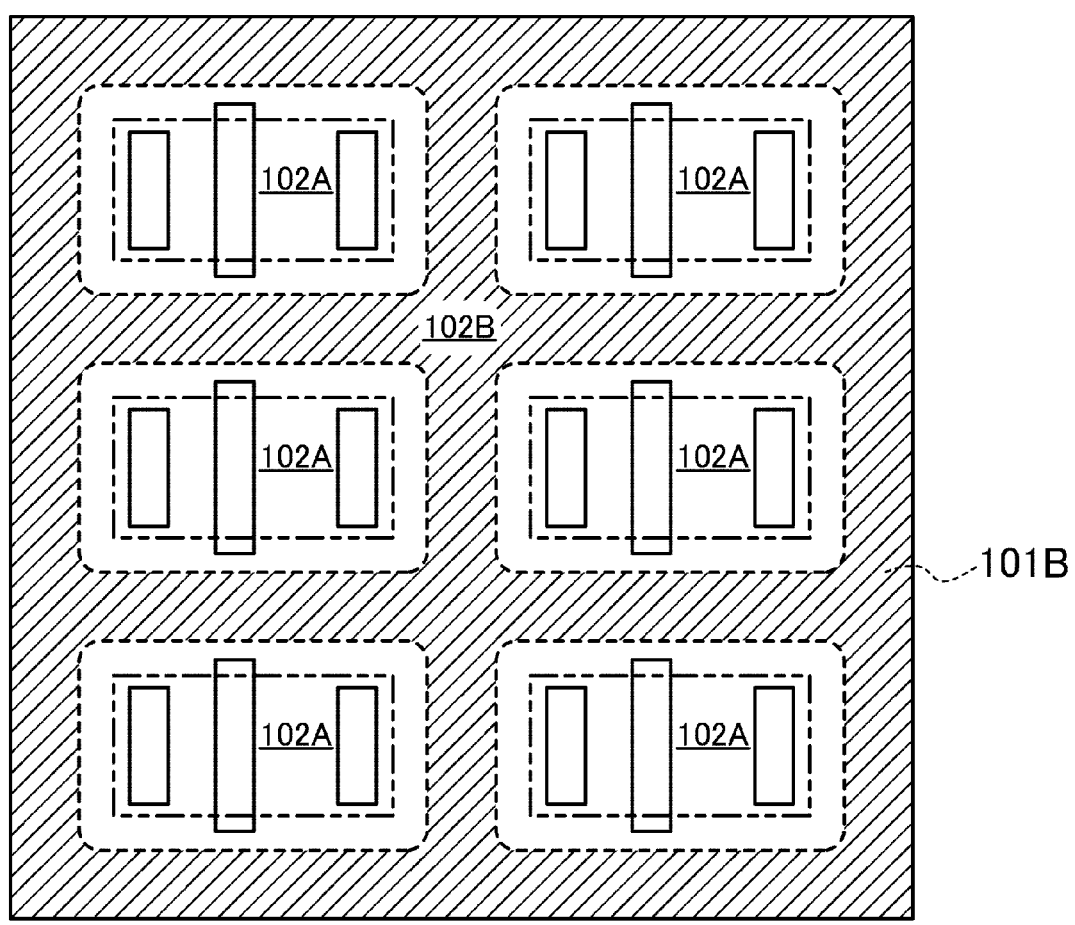
FIG. 20 is a top view illustrating a semiconductor device according to a variation of the first and second embodiments.

In the first and second embodiments, an example has been described where the single semiconductor element is formed on the semiconductor substrate. However, similar advantages may be provided where a plurality of semiconductor elements are formed on a semiconductor substrate. In this case, as shown in FIG. 19, the interface current block region 101B may be formed at an outer edge of the semiconductor substrate to surround a plurality of element regions 102A. Alternatively, as shown in FIG. 20, the interface current block region 101B may be formed to surround each of the element regions 102A. A similar structure is used, where an interface current block region containing n-type impurities, and an interface current block region including a first region containing p-type impurities and a second region containing n-type impurities are formed. Where the first region and the second region are formed, one of the regions may surround the element regions 102A individually, and the other one may surround the plurality of element regions 102A as a whole. Alternatively, the nitride semiconductor layer 102 is selectively removed above the interface current block region and at an outer side of the element regions 102A to expose an outer edge of the semiconductor substrate 101. Note that the number of the element regions 102A is not particularly limited. While in FIGS. 19 and 20, an example has been described where the element regions 102A are all transistors, other elements such as diodes may be formed.

As such, if a plurality of semiconductor elements are provided on a semiconductor substrate including an interface current block region to form an integrated device such as an inverter, converter, or the like, the breakdown voltage of the integrated device can be largely improved.

In the first and second embodiments, an example has been described where a transistor and a diode include a channel layer and a cap layer which are made of nitride semiconductor, the semiconductor element may be other types of transistor and diode. For example, it may be a bipolar transistor, a pn junction diode, a pin junction diode, etc. made of nitride semiconductor. Where a through electrode is surrounded by the interface current block region on the top surface of the semiconductor substrate, a leakage current flowing through the interface between the semiconductor layer and the semiconductor substrate from the through electrode in a horizontal direction can be reduced. This also reduces a leakage current, which flows through the interface between the semiconductor layer and the semiconductor substrate in a horizontal direction, in the longitudinal direction via the through electrode. Thus, the structures shown in the first and second embodiments are applicable to all semiconductor devices each including a through electrode penetrating a semiconductor layer and a semiconductor substrate. The through electrode is not necessarily connected to a source electrode only, but also to a drain electrode or a gate electrode. Where the element is a diode, the through electrode may be connected to an anode electrode, or to a cathode electrode.

In the first and second embodiments, an example has been described where the semiconductor substrate is a Si substrate. In place of the Si substrate, it may be a silicon carbide (SiC) substrate, a gallium arsenide (GaAs) substrate, a gallium nitride (GaN) substrate, a zinc oxide (ZnO) substrate, or the like.

In the first and second embodiments, where the semiconductor substrate is a Si substrate, the p-type impurities may be boron (B) etc., and the n-type impurities may be phosphorus (P) etc.

In the first and second embodiments, an example has been described where the isolation region does not reach the buffer layer. However, it may reach the buffer layer. Furthermore, it may reach the semiconductor substrate. The isolation region may be formed by doping impurities which does not contribute to the conductivity type of argon (Ar) etc.

According to the present disclosure, a semiconductor device made of nitride semiconductor and formed on a semiconductor substrate improves a breakdown voltage in the longitudinal direction, and is useful as a nitride semiconductor device which is particularly applicable to a power transistor etc. used in a power supply circuit.

What is claimed is:

1. A nitride semiconductor device comprising:
   a semiconductor substrate having an upper surface and a lower surface opposing the upper surface; and
   a nitride semiconductor layer formed on the upper surface of the semiconductor substrate, wherein
   the semiconductor substrate includes a normal region and an interface current block region surrounding the normal region,
   the interface current block region extends from the upper surface of the semiconductor substrate,
   the nitride semiconductor layer includes an element region and an isolation region surrounding the element region,
   the element region is formed over the normal region, and
   the interface current block region contains impurities, and forms a potential barrier against carriers generated at an interface between the nitride semiconductor layer and the semiconductor substrate.

2. The nitride semiconductor device of claim 1, wherein
   the interface current block region contains impurities of a same conductivity type as impurities in the normal region, and
   the interface current block region has a higher impurity concentration than the normal region.

3. The nitride semiconductor device of claim 1, wherein the interface current block region contains impurities of a different conductivity type from impurities in the normal region.

4. The nitride semiconductor device of claim 1, wherein
   the interface current block region includes
      a first region containing impurities of a same conductivity type as impurities in the normal region, and
      a second region containing impurities of a different conductivity type from impurities in the normal region, and
   the first region has a higher impurity concentration than the normal region.

5. The nitride semiconductor device of claim 4, wherein the first region is spaced apart from the second region.

6. The nitride semiconductor device of claim 1, wherein the interface current block region is formed in a portion other than directly under the element region of the semiconductor substrate.

7. The nitride semiconductor device of claim 1, wherein the interface current block region is exposed on a side surface of the semiconductor substrate.

8. The nitride semiconductor device of claim 1, wherein the semiconductor substrate includes a depletion layer formation region formed on an inner side of the interface current block region, spaced apart from the interface current block region, and containing impurities of a different conductivity type from impurities in the normal region.

9. The nitride semiconductor device of claim 1, wherein the semiconductor substrate includes a plurality of depletion layer formation regions, each formed on an inner side of the interface current block region, spaced apart from the interface current block region, and containing impurities of a different conductivity type from impurities in the normal region, and
the plurality of depletion layer formation regions are spaced apart from each other.

10. The nitride semiconductor device of claim 1, wherein the nitride semiconductor layer is formed on a region of the semiconductor substrate on an inner side of the interface current block region.

11. The nitride semiconductor device of claim 1, wherein the nitride semiconductor layer includes
a first layer, and
a second layer formed on the first layer and having a greater bandgap than the first layer.

12. The nitride semiconductor device of claim 11, further comprising:
a source electrode;
a drain electrode; and
a gate electrode.

13. The nitride semiconductor device of claim 12, wherein the nitride semiconductor layer includes a third layer selectively formed on the second layer and containing p-type impurities, and
the gate electrode is formed on the third layer.

14. The nitride semiconductor device of claim 11, further comprising a cathode electrode and an anode electrode, which are formed on the nitride semiconductor layer.

15. The nitride semiconductor device of claim 1, further comprising:
a source electrode, a drain electrode, and a gate electrode, which are formed on the nitride semiconductor layer; and
a gate insulating film formed between the gate electrode and the nitride semiconductor layer, wherein
the nitride semiconductor layer includes
an n-type first layer, a p-type second layer, and an n-type third layer, which are sequentially formed on the semiconductor substrate, and
a recess penetrating the third layer and the second layer, and reaching the first layer,
the drain electrode is formed in contact with the first layer,
the source electrode is formed in contact with the third layer, and the gate electrode is formed to fill the recess with the gate insulating film interposed therebetween.

16. The nitride semiconductor device of claim 1, wherein the interface current block region has an impurity concentration of $1 \times 10^{16}$ cm$^{-3}$ or more.

17. The nitride semiconductor device of claim 1, further comprising:
a back surface electrode formed on the lower surface of the semiconductor substrate; and
a through electrode penetrating the nitride semiconductor layer and the semiconductor substrate, and connected to the back surface electrode.

18. The nitride semiconductor device of claim 17, wherein the through electrode is surrounded by the interface current block region on the upper surface of the semiconductor substrate.

19. The nitride semiconductor device of claim 17, wherein the through electrode is formed to penetrate the interface current block region.

20. The nitride semiconductor device of claim 17, further comprising
a source electrode, a drain electrode, and a gate electrode, which are formed on the nitride semiconductor layer, wherein
the through electrode is connected to any one of the source electrode, the drain electrode, or the gate electrode.

21. The nitride semiconductor device of claim 1, wherein the semiconductor substrate is a single layer.

22. The nitride semiconductor device of claim 1, wherein the semiconductor substrate is one of a silicon substrate, a silicon carbide substrate, a gallium arsenide substrate, a gallium nitride substrate and a zinc oxide substrate.

* * * * *